United States Patent
Shimizu et al.

(10) Patent No.: US 7,750,394 B2
(45) Date of Patent: Jul. 6, 2010

(54) NONVOLATILE SEMICONDUCTOR MEMORY

(75) Inventors: Tatsuo Shimizu, Tokyo (JP); Koichi Muraoka, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 29 days.

(21) Appl. No.: 12/189,400

(22) Filed: Aug. 11, 2008

(65) Prior Publication Data

US 2009/0166710 A1 Jul. 2, 2009

(30) Foreign Application Priority Data

Dec. 28, 2007 (JP) ............................. 2007-340489

(51) Int. Cl.
*H01L 29/94* (2006.01)

(52) U.S. Cl. ................ 257/316; 257/314; 257/315; 257/321; 257/E21.662; 257/E29.129; 257/E29.3

(58) Field of Classification Search ......... 257/314–316, 257/321, E21.662, E29.129, E29.3
See application file for complete search history.

(56) References Cited

U.S. PATENT DOCUMENTS 7,154,143 B2 * 12/2006 Jung ........................... 257/324
7,279,740 B2 * 10/2007 Bhattacharyya et al. ..... 257/324

2006/0211205 A1 * 9/2006 Jeon et al. ................... 438/264
2007/0132003 A1 6/2007 Takashima et al.

FOREIGN PATENT DOCUMENTS

JP 2007-165468 6/2007

OTHER PUBLICATIONS

U.S. Appl. No. 12/050,427, filed Mar. 18, 2008, Tatsuo Shimizu, et al.
U.S. Appl. No. 12/051,274, filed Mar. 19, 2008, Tatsuo Shimizu, et al.
U.S. Appl. No. 11/854,090, filed Sep. 12, 2007, Tatsuo Shimizu, et al.

* cited by examiner

*Primary Examiner*—N Drew Richards
*Assistant Examiner*—Yu-Hsi Sun
(74) *Attorney, Agent, or Firm*—Oblon, Spivak, McClelland, Maier & Neustadt, L.L.P.

(57) ABSTRACT

A nonvolatile semiconductor memory device includes: a semiconductor substrate; and a memory cell. The memory cell includes: a source region and a drain region formed at a distance from each other on the semiconductor substrate; a tunnel insulating film formed on a channel region of the semiconductor substrate, the channel region being located between the source region and the drain region; a charge storage film formed on the tunnel insulating film; a charge block film formed on the charge storage film; and a control electrode that is formed on the charge block film. The control electrode includes a Hf oxide film or a Zr oxide film having at least one element selected from the first group consisting of V, Cr, Mn, and Tc added thereto, and having at least one element selected from the second group consisting of F, H, and Ta added thereto.

26 Claims, 17 Drawing Sheets

NONVOLATILE SEMICONDUCTOR MEMORY

CROSS-REFERENCE TO RELATED APPLICATION

This application is based upon and claims the benefit of priority from prior Japanese Patent Application No. 2007-340489 filed on Dec. 28, 2007 in Japan, the entire contents of which are incorporated herein by reference.

BACKGROUND OF THE INVENTION

1. Field of the Invention

The present invention relates to a nonvolatile semiconductor memory.

2. Related Art

A flash memory that is a nonvolatile semiconductor memory is normally a nonvolatile memory that does not need an electric retaining operation (a retention power supply) for storage. Accordingly, programs and the likes can be readily written in a flash memory after the completion of the product, and flash memories are often used in electronic apparatuses. However, there is a demand for a further reduction in size and low-voltage operations in NAND flash memories developed after the next generation.

In each memory cell of a NAND flash memory, a source region and a drain region are formed at a distance from each other on a silicon substrate. A stacked structure is formed on the channel region portion of the silicon substrate located between the source region and the drain region. The stacked structure is formed with a tunnel insulating film, a charge trap film made of silicon nitride, a charge block film made of an insulating material, and a control electrode. If the charge trap film is made of polysilicon, it is also called a floating gate film (FG film). In that case, the charge block film is called an IPD (Inter-Poly Dielectric) film.

In an erasing operation, a high negative voltage is normally applied to the control electrode, so as to release the electrons from the charge trap film (or the FG film) toward the channel region. At this point, electrons might be injected into the charge trap film from the control electrode. To prevent electron injection from the control electrode during an erasing operation, the control electrode should have a large work function.

To apply a high voltage to the tunnel insulating film, the charge block film (or the IPD film) is made of an oxide dielectric material with a high dielectric constant. It is a known fact that, if a metal having a large work function is used as the control electrode, the Fermi level is pinned in the mid-gap direction of Si. Due to this phenomenon, even if the control electrode has a large work function, the effective work function tends to become smaller, and a material or a structure having a sufficiently large effective work function is not obtained.

Meanwhile, in a writing operation, a high positive voltage is normally applied to the control electrode, so as to introduce the electrons into the charge trap film (or the FG film) from the channel region. At this point, holes might be injected from the control electrode. To prevent hole injection from the control electrode during a writing operation, the control electrode should not have a very large work function.

The effective work function becomes smaller than the original work function, because an oxygen defect is caused in a high-dielectric oxide. To solve this problem, an oxide electrode may be used as the control electrode. For example, JP-A 2007-165468 (KOKAI) discloses the use of an oxide electrode. In JP-A 2007-165468 (KOKAI), an oxide conductor such as $SrRuO_3$ is used as an electrode.

In a case where the technique disclosed in JP-A 2007-165468 (KOKAI) is utilized, it is extremely difficult to adjust the effective work function to an optimum value, because 1) the work function of a metal is fixed, and 2) the bandwidth of a metal is large. If the bandwidth is large, the Fermi level hardly varies even when electrons are injected or released. To achieve the high performance expected in a NAND flash memory developed after the next generation, or to perform high-speed writing and high-speed erasing, it is necessary to develop a technique of optimizing the effective work function of the control electrode.

SUMMARY OF THE INVENTION

The present invention has been made in view of these circumstances, and an object thereof is to provide a nonvolatile semiconductor memory that can perform high-speed writing and high-speed erasing.

A nonvolatile semiconductor memory according to a first aspect of the present invention includes: a semiconductor substrate; and a memory cell including: a source region and a drain region formed at a distance from each other on the semiconductor substrate; a tunnel insulating film formed on a channel region of the semiconductor substrate, the channel region being located between the source region and the drain region; a charge storage film formed on the tunnel insulating film; a charge block film formed on the charge storage film; and a control electrode that is formed on the charge block film, the control electrode including a Hf oxide film or a Zr oxide film having at least one element selected from the first group consisting of V, Cr, Mn, and Tc added thereto, and having at least one element selected from the second group consisting of F, H, and Ta added thereto.

A nonvolatile semiconductor memory according to a second aspect of the present invention includes: a semiconductor substrate; and a memory cell including: a source region and a drain region formed at a distance from each other on the semiconductor substrate; a tunnel insulating film formed on a channel region of the semiconductor substrate, the channel region being located between the source region and the drain region; a charge storage film formed on the tunnel insulating film; a charge block film formed on the charge storage film; an oxide film formed on the charge block film, the oxide film including a Hf oxide film or a Zr oxide film having at least one element selected from the first group consisting of V, Cr, Mn, and Tc added thereto, and having at least one element selected from the second group consisting of F, H, and Ta added thereto; and a control electrode formed on the oxide film.

A nonvolatile semiconductor memory according to a third aspect of the present invention includes: a semiconductor substrate; and a memory cell including: a source region and a drain region formed at a distance from each other on the semiconductor substrate; a tunnel insulating film formed on a channel region of the semiconductor substrate, the channel region being located between the source region and the drain region; a charge storage film formed on the tunnel insulating film; a charge block film formed on the charge storage film; and a control electrode formed on the charge block film, the control electrode including a Hf oxide film or a Zr oxide film having at least one element selected from the first group consisting of Nb, Mo, W, and Re added thereto, and having at least one element selected from the second group consisting of N, C, B, Mg, Ca, Sr, Ba, Al, Sc, Y, La, Ce, Pr, Nd, Pm, Sm, Eu, Gd, Tb, Dy, Ho, Er, Tm, Yb, and Lu added thereto.

A nonvolatile semiconductor memory according to a fourth aspect of the present invention includes: a semiconductor substrate; and a memory cell including: a source region and a drain region formed at a distance from each other on the semiconductor substrate; a tunnel insulating film formed on a channel region of the semiconductor substrate, the channel region being located between the source region and the drain region; a charge storage film formed on the tunnel insulating film; a charge block film formed on the charge storage film; an oxide film formed on the charge block film, the oxide film including a Hf oxide film or a Zr oxide film having at least one element selected from the first group consisting of Nb, Mo, W, and Re added thereto, and having at least one element selected from the second group consisting of N, C, B, Mg, Ca, Sr, Ba, Al, Sc, Y, La, Ce, Pr, Nd, Pm, Sm, Eu, Gd, Tb, Dy, Ho, Er, Tm, Yb, and Lu added thereto; and a control electrode formed on the oxide film.

DETAILED DESCRIPTION OF THE INVENTION

The following is a description of embodiments of the present invention, with reference to the accompanying drawings.

Figure 1:
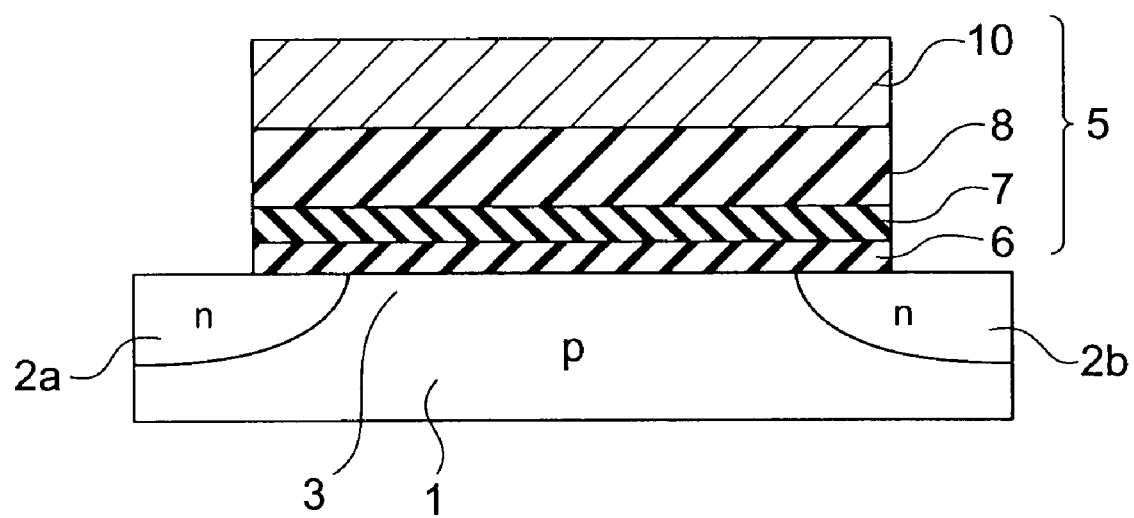
FIG. 1 is a cross-sectional view of a memory cell of a nonvolatile semiconductor memory in accordance with one embodiment and a first example.
Figure 2:
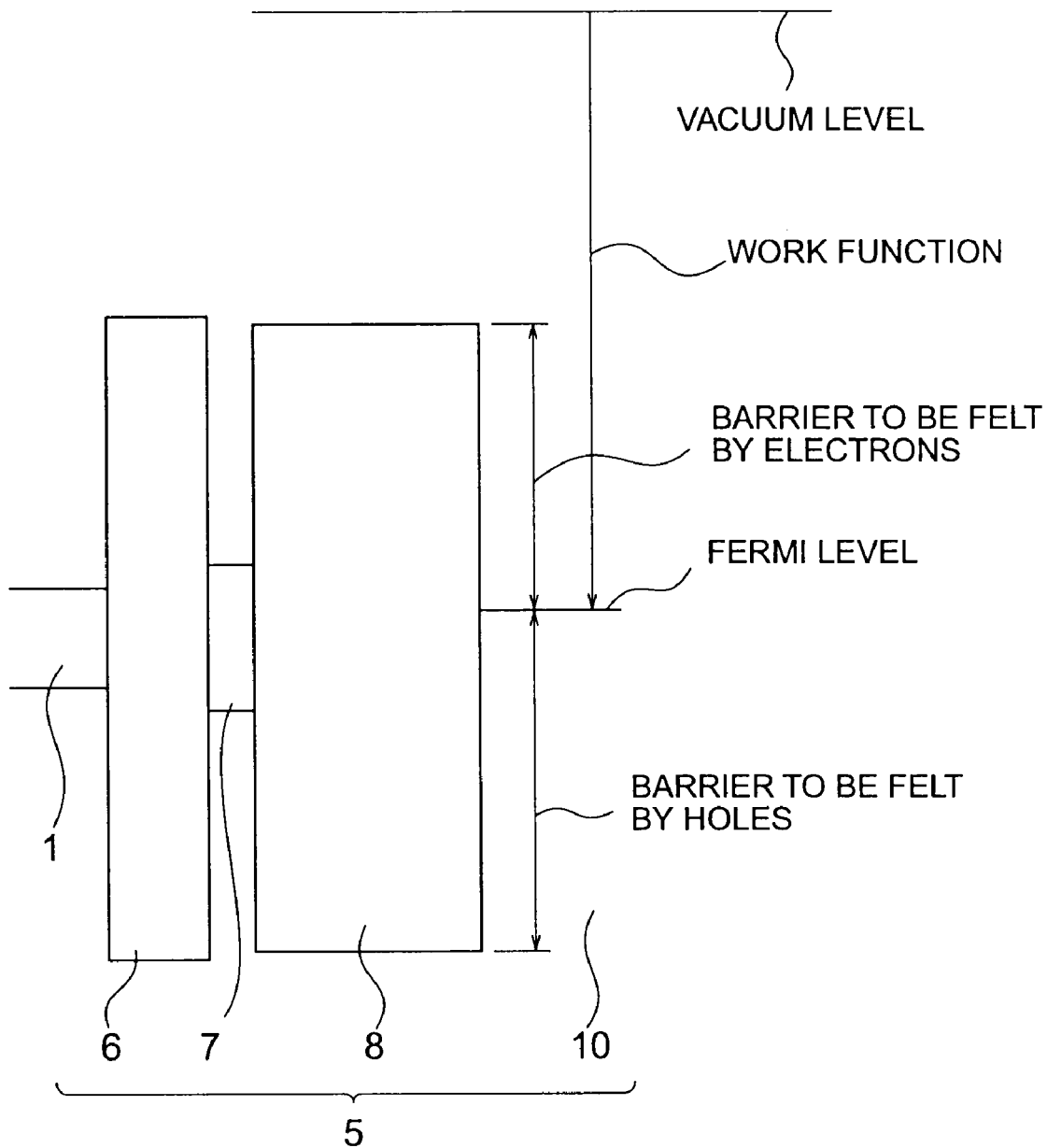
FIG. 2 is a schematic view of the energy band structure of the memory cell shown in FIG. 1.

A nonvolatile semiconductor memory in accordance with an embodiment of the present invention is described. This nonvolatile semiconductor memory is a charge storing memory, and includes memory cells that are arranged in a matrix form. As shown in FIG. 1, each of the memory cells has an n-type source region 2a and an n-type drain region 2b formed at a distance from each other on a p-type silicon substrate 1, for example. The region of the silicon substrate 1 located between the source region 2a and the drain region 2b serves as a channel region 3 that is a current path. A gate 5 for controlling memory operations is provided on the channel region 3. The gate 5 is a stacked structure that includes a tunnel insulating film 6, a charge storage film 7, a charge block film 8, and a control electrode 10 stacked in this order on the channel region 3. FIG. 2 shows the energy band of the gate 5. The energy difference between the vacuum level and the Fermi level of the control electrode 10 is the work function of the control electrode 10. The energy difference between the above Fermi level and the end of the energy band of the charge block film 8 on the side of the conduction band is the barrier to be felt by electrons. The energy difference between the above Fermi level and the end of the energy band of the charge block film 8 on the side of the valence band is the barrier to be felt by holes. Therefore, the work function of the control electrode 10 should be sufficiently deep but not too deep. One of the features of this embodiment of the present invention lies in controlling the work function of the control electrode to remain within an appropriate range.

Figure 3:
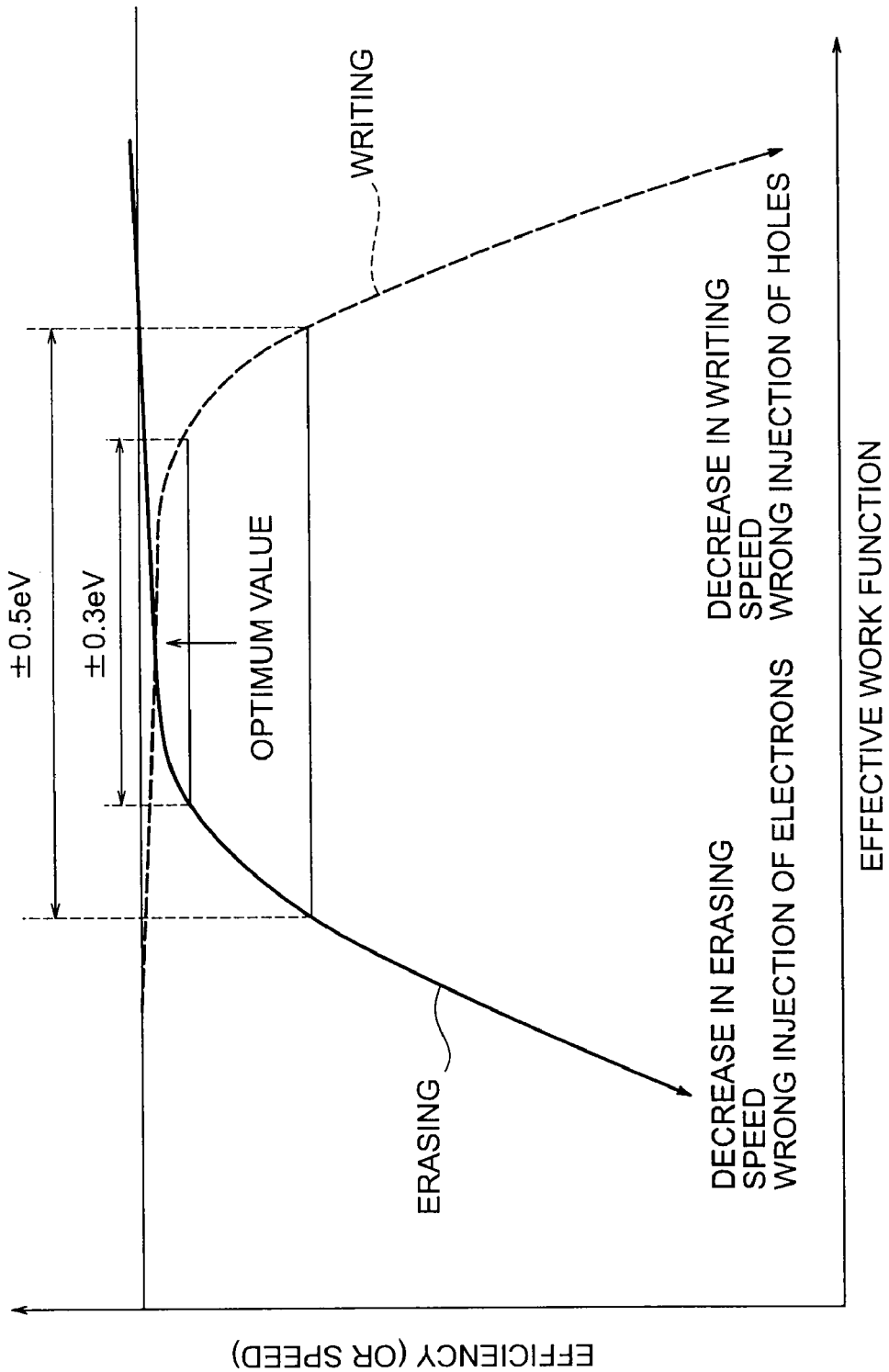
FIG. 3 is a characteristics curve showing the dependency of the writing efficiency and the erasing efficiency on the effective work function in the nonvolatile semiconductor memory in accordance with the one embodiment.
Figure 4:
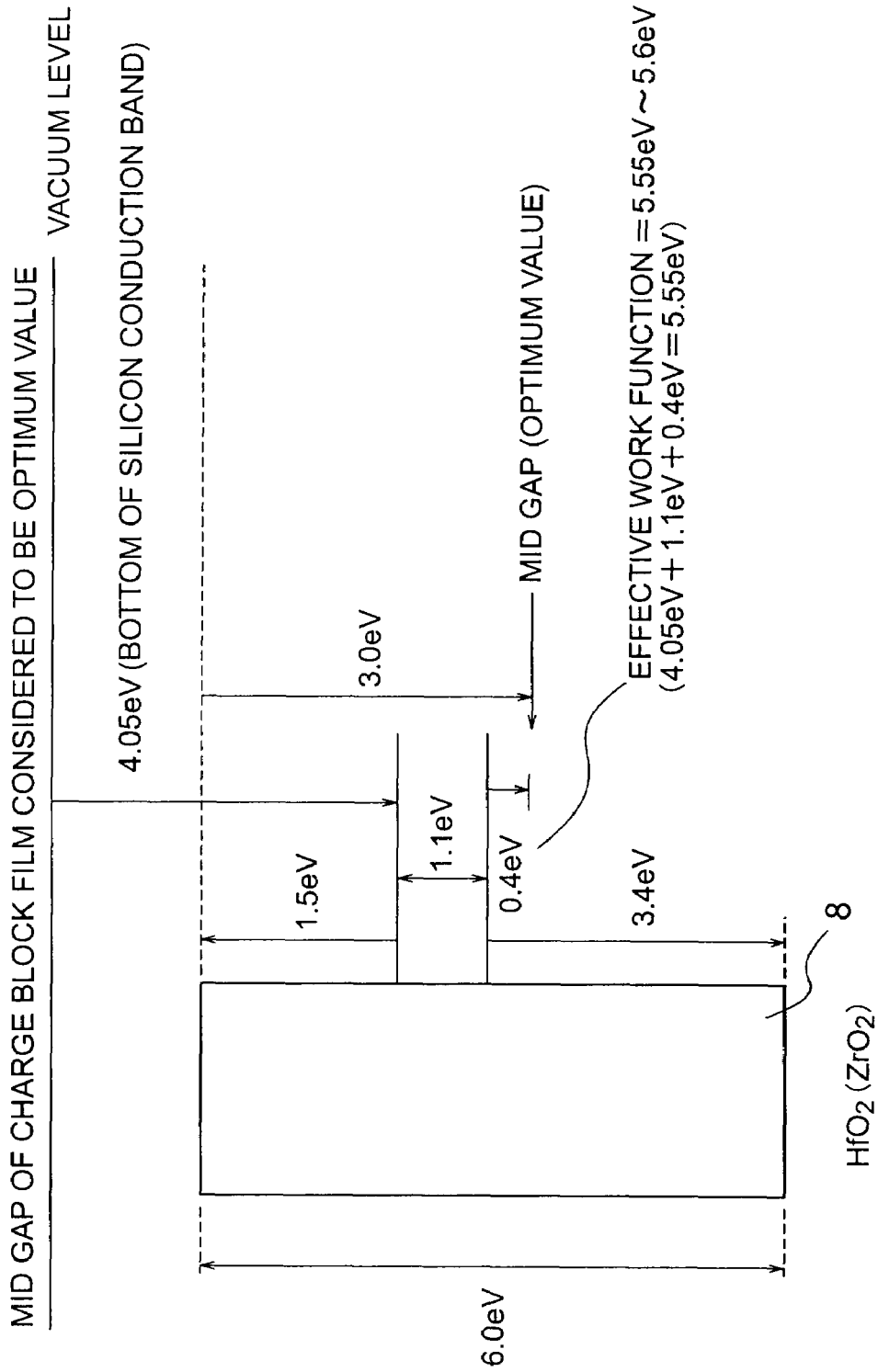
FIG. 4 is an energy band diagram for explaining that the mid gap of the charge block film is the optimum position of the effective work function.

Referring now to FIGS. 3 and 4, the optimum value of the effective work function of the control electrode is described.

FIG. 3 shows the dependence of the writing efficiency (or the writing speed) and the erasing efficiency (or the erasing speed) on the effective work function. In FIG. 3, the broken line indicates the characteristics of the writing efficiency, and the solid line indicates the characteristics of the erasing efficiency. As the effective work function becomes larger, the barrier to be felt by electrons becomes larger. Accordingly, as can be seen from the characteristic graph of the erasing efficiency, a wrong injection of electrons is not caused during a memory erasing operation. At the same time, however, the barrier to be felt by holes becomes smaller. As a result, as can be seen from the characteristic graph of the writing efficiency indicated by the broken line in FIG. 3, if the effective work function becomes too large, a wrong hole injection is caused at the time of writing, and the writing efficiency becomes lower.

On the other hand, as the effective work function becomes smaller, the barrier to be felt by holes becomes larger. Accordingly, as can be seen from the characteristic graph of the writing efficiency, as the effective work function becomes smaller, a wrong injection of holes is not caused during a memory writing operation. At the same time, however, the barrier to be felt by electrons becomes smaller. As a result, as can be seen from the characteristic graph of the erasing efficiency indicated by the solid line in FIG. 3, if the effective work function becomes too small, a wrong electron injection is caused at the time of erasing, and the erasing efficiency becomes lower. Thus, it is considered that there is an optimum range for the effective work function.

FIG. 4 is an energy band diagram for explaining that the mid gap of the charge block film is the optimum position of the effective work function.

Since there are no oxide dielectric materials having an extremely large bandgap, it is safe to say that an optimum value of the effective work function is in the position where the barrier against electrons and the barrier against holes become substantially equal to each other, if an oxide dielectric material is used as the charge block film. For example, if a $HfO_2$ film or a $ZrO_2$ film is used as the charge block film 8, as shown in FIG. 4, the band offset from Si is approximately 1.5 eV on the side of the conduction band, and 3.4 eV on the side of the valence band. The bandgap of Si is approximately 1.1 eV. Therefore, an optimum effective work function is approximately 5.6 eV, which is about 0.4 deeper than the valence band of Si. In other words, the mid gap of $HfO_2$ or $ZrO_2$ is equivalent to the optimum effective work function.

In the case where a $HfO_2$ film or a $ZrO_2$ film is used as the charge block film 8, the energy bandgap is 6.0 eV. Therefore, as long as the Fermi level of the control electrode 10 falls within the range of ±10% of 3.0 eV (=6.0/2), or ±0.3 eV, from the mid gap of the charge block film 8, almost no wrong electron injections are caused at the time of erasing, and almost no wrong hole injections are caused at the time of writing, as indicated by the characteristic graph shown in FIG. 3. If the Fermi level of the control electrode 10 is within the range of ±0.5 eV from the mid gap of the charge block film 8, a wrong electron injection is not often caused during erasing operations, and a wrong hole injection is not often caused during writing operations. To sum up, high-speed writing and high-speed erasing can be expected if the work function of the control electrode 10 is within the range of 5.1 eV to 6.1 eV, and even higher-speed writing and higher-speed erasing can be expected if the work function of the control electrode 10 is within the range of 5.3 eV to 5.9 eV.

The band offset of an oxide dielectric material from Si tends to be smaller on the electron side. Therefore, a work function deeper than the end of the valence band of Si (5.2 eV) is preferable. In general, high-speed erasing and high-speed writing can be expected, if a control electrode having an effective work function in the range of 5.3 eV to 5.9 eV is used.

If the control electrode made of $SrRuO_3$ disclosed in JP-A 2007-165468 (KOKAI) is used, for example, the work function of the control electrode is approximately 5.1 eV. However, the effective work function decreases to a value slightly less than 5.0 eV. This is a larger value than a value in a conventional case, but is still much smaller than the optimum value of 5.6 eV. This is mainly because a sufficiently large work function is not obtained from a conventional metal oxide. Furthermore, since large band energy dispersion is caused (the bandwidth is large), electrons move toward the control electrode. As a result, the effective work function becomes smaller. Since the band width is large, the band position in the gap does not move even when electrons are injected or released by the technique according to an embodiment of the present invention. Therefore, fine adjustment cannot be performed on the work function of the electrode.

The embodiment of the present invention discloses a technique of forming a "metal oxide having a sufficiently large work function and a band with a small width in the gap". By the same technique, an "insulating oxide film having a sufficiently large work function and a level in a gap with a small band width" can be formed.

For example, Mo is added to a dielectric oxide of $HfO_2$. In the following, an example case of $HfO_2$ as a dielectric oxide is described. However, the same effects as the effects of the example case can be achieved even if $ZrO_2$, Hf silicate, or Zr silicate is used in place of $HfO_2$. In the example case, a level appears in the $HfO_2$ bandgap, due to Mo. The level in the gap forms an even narrower band, because of the interactions between Mo additives. By adding Mo to $HfO_2$, a metal oxide having a level of a narrow band in the gap (a metal oxide made of $HfO_2$ having Mo added thereto) can be generated. Here, the work function is determined by the level, and becomes approximately 4.75 eV.

The conditions for an insulating oxide film to turn into a metal in a case where an additional material is introduced are now described. If one or more additional materials are introduced into a unit of 2a×2a×2a (where a represents the lattice constant), $HfO_2$, which is originally an insulating material, is turned into a metallic material, due to the interaction between the additional materials. This can be converted to $1\times10^{14}$ $cm^{-2}$ in areal density. At this point, a band structure that has a narrow level in the gap is formed. The level has a small band width and small dispersion in the gap (a narrow and small dispersion band). Since it is impossible to add an additional amount more than $8\times10^{14}$ $cm^{-2}$, this value is set as the maximum value.

When the areal density of the additional material is in the range of $1\times10^{14}$ $cm^{-2}$ to $8\times10^{14}$ $cm^{-2}$, a metallic level appears in the gap. This film can be used as the control electrode, as it is. By inserting this metal thin film is inserted to the interface between the charge block film and the control electrode, a thin film having an interfacial state introduced thereto is formed, and the Fermi level can be pinned.

The oxide film for controlling the interface does not need to be turned into a metallic material, as long as the oxide film is a thin film. To pin the Fermi level, one state should be formed on a surface of 8a×8a in size. In this case, the areal density of the additional material is $6\times10^{12}$ $cm^{-2}$ or higher, accordingly. If the physical film thickness of the $HfO_2$ film becomes thicker than 2 nm in this case, the resistance becomes higher. Therefore, if the oxide film is not turned into a metallic material, the film thickness should be 2 nm or smaller. Otherwise, the EOT becomes larger. If one or more additional materials are introduced into each area of 2a×2a, metallization occurs (hopping conduction becomes possible), and the restriction on the film thickness is lifted. Therefore, if the areal density of the additional material is $1\times10^{14}$ $cm^{-2}$ or higher, the restriction on the film thickness of the oxide film is lifted.

If the areal density of the additional material is in the range of $6\times10^{12}$ $cm^{-2}$ or more but less than $1\times10^{14}$ $cm^{-2}$, a level appears in the gap, but the oxide film is not turned into a metallic material. If a thin oxide film having the gap in this state is inserted to the interface between the charge block film and the control electrode, a thin film having an interfacial state introduced thereto is formed, and the Fermi level can be pinned.

Figure 5:
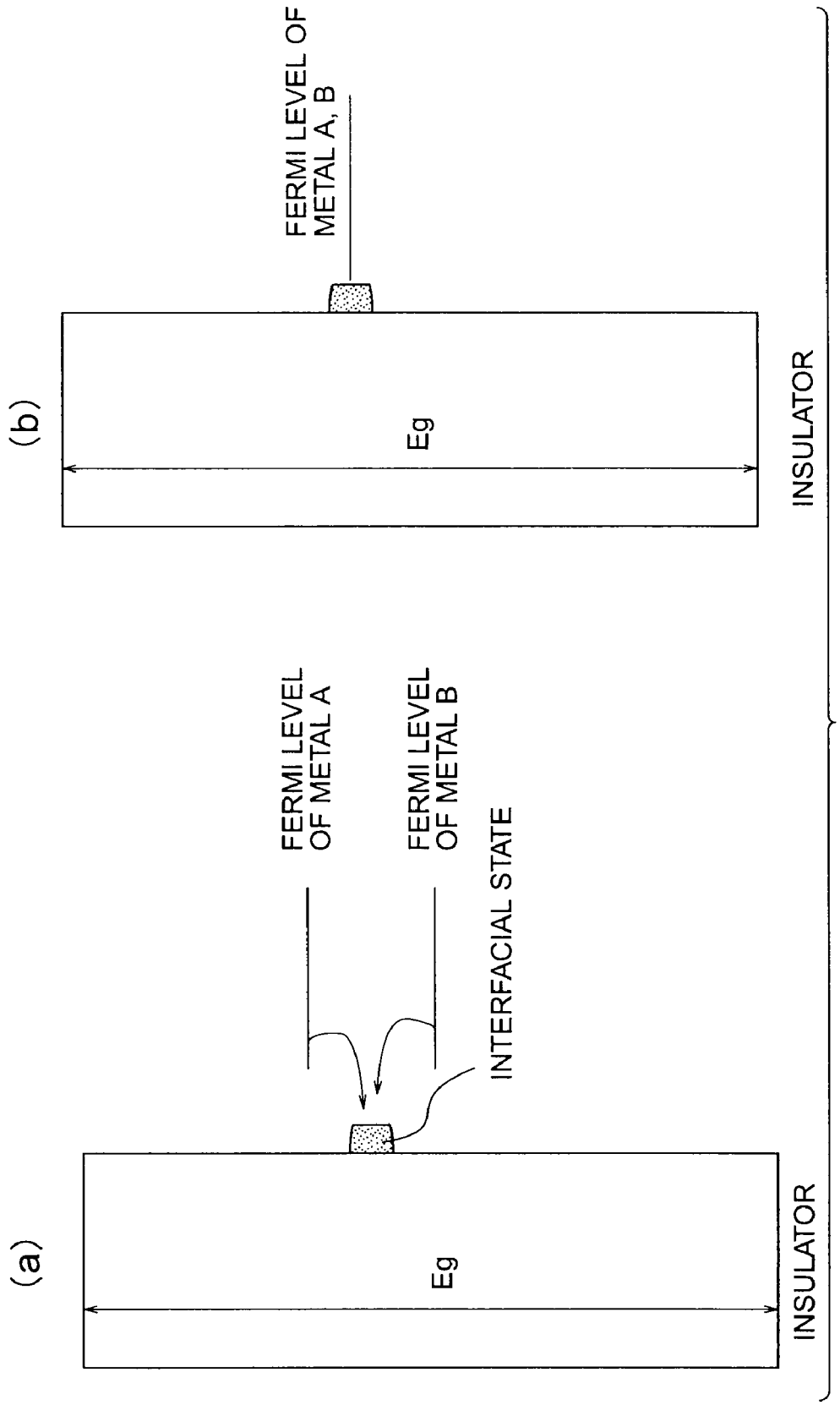
FIG. 5 is a schematic view for explaining the insertion effect of an interfacial state into the interface between an insulating material and a metal.

Referring now to FIGS. 5(a) and 5(b), the Fermi level pinning with an interfacial state is briefly described. When there is an interfacial state existing at the interface between an insulating material and a metal, electrons can be moved between the interfacial state and the contact metal, so as to adjust the work function of the metal to the position of the interfacial state. This phenomenon (caused by the interfacial state) is called the Fermi level pinning. In the case of a metal A shown in FIG. 5(a), electrons flow into the interfacial state from the metal side, and the energy level of the metal A becomes lower. As a result, the effective work function of the metal A becomes larger. In the case of a metal B, on the other hand, electrons move from the interfacial state to the metal B, and the energy level of the metal B becomes higher. As a result, the effective work function of the metal B becomes smaller. Here, the effective work function does not depend on the metal, but is determined by the energy position of the interfacial state, as shown in FIG. 5(b). In FIGS. 5(a) and 5(b), Eg represents the energy gap of the insulating material. In an embodiment of the present invention, this interfacial state is artificially induced by an oxide thin film, and the energy position of the interfacial state is adjusted so as to optimize the effective work function.

Oxygen is coordinated around the material added to $HfO_2$ (or $ZrO_2$, Hf silicate, or Zr silicate). At this point, the level in the gap is formed with the d electrons of the added material, and has a double-degenerate $dz^2$ orbit and $dx^2-y^2$ orbit. In the orbits, four electrons of each added material can be buried at a maximum. The difference between the number of outermost electrons of the additional material and the four outermost electrons of Hf is stored in the level in the gap. For example, in the case of Mo, there are six outermost electrons. Four of them are transferred to $HfO_2$, but two electrons (=6−4) remain. The remaining electrons are stored in the level of Mo that appears in the gap of $HfO_2$.

Figure 6:
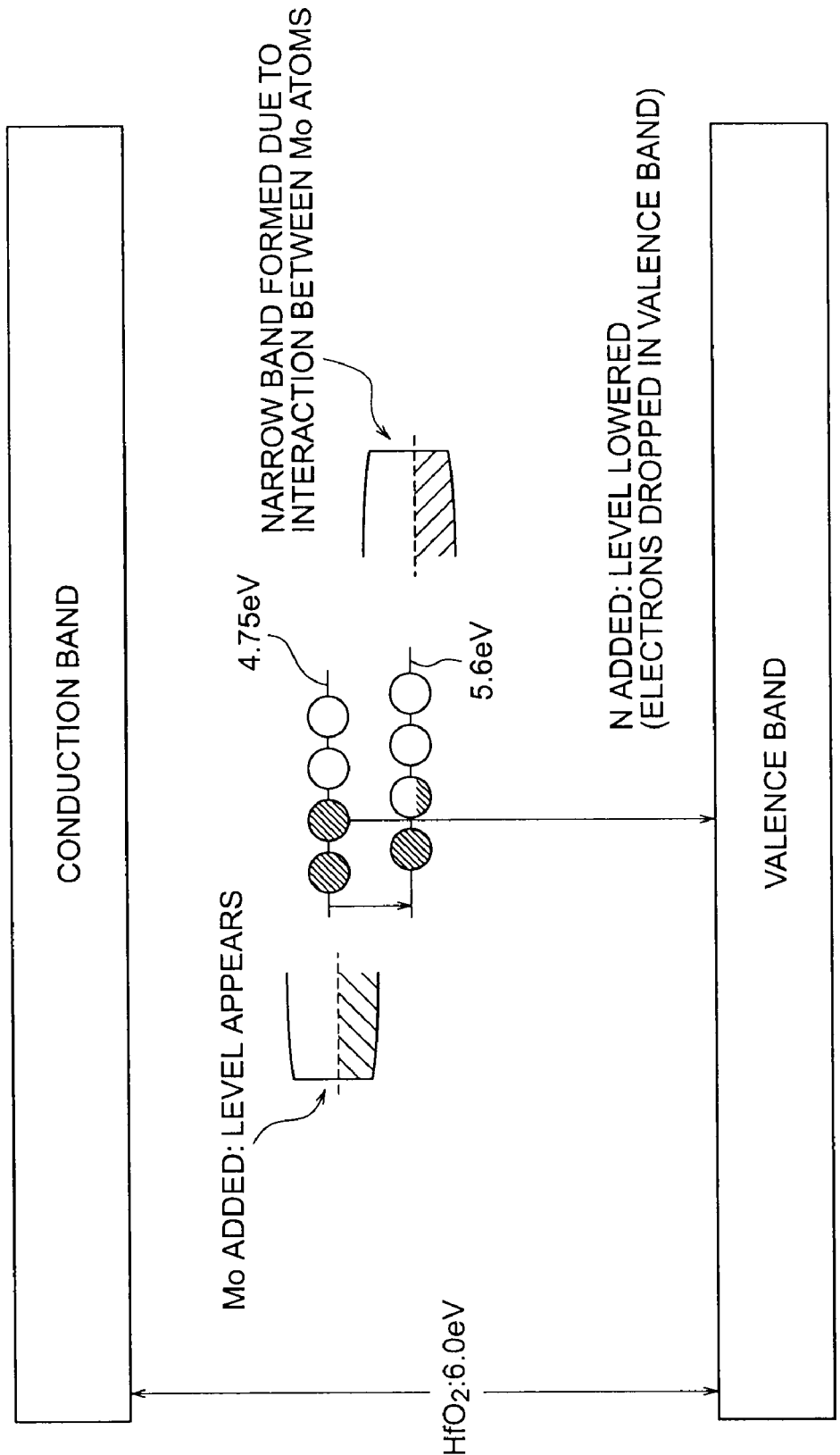
FIG. 6 is a schematic view for explaining the level caused in the gap when a high-valence material Mo or N is added to $HfO_2$.

In the above example, Mo is added to a dielectric oxide formed with $HfO_2$. If nitrogen is further introduced, electrons can be released from the Mo level. The introduced nitrogen replaces the oxygen. Since the number of electrons nitrogen can accept is one larger than the number of electrons oxygen can accept, the introduced nitrogen accepts electrons from Mo, and the film is stabilized. As a result, the number of electrons in the Mo level becomes smaller. As the interaction between the electrons is reduced accordingly, the level becomes lower. As shown in FIG. 6, when Mo is added, a narrow band having a level appears in the neighborhood of 4.75 eV. When one nitrogen atom is added to each two Mo atoms, a metal oxide having a work function in the neighborhood of 5.6 eV is generated. To sum up, it has become clear that the work function can be controlled by adjusting the amount of nitrogen.

Since nitrogen accepts electrons, it is called an electron acceptor in this specification. There are other electron acceptors. As materials that can replace oxygen, carbon (C) and boron (B) have the same characteristics as nitrogen. In the case of carbon, the number of electrons to be accepted is two. In the case of boron, the number of electrons to be accepted is three. In an embodiment of the present invention, an oxide of Hf or Zr may be employed. If Mg, Ca, Sr, Ba, Al, Sc, Y, La, or a lanthanoid (Ce, Pr, Nd, Pm, Sm, Eu, Gd, Tb, Dy, Ho, Er, Tm, Yb, or Lu) is replaced with Hf or Zr, the same characteristics can be obtained. Any of those materials has a smaller valence number, and cannot release electrons, unlike Hf and Zr. Accordingly, oxygen can accept electrons from other materials, and an electron shortage occurs. As a result, it becomes possible to accept electrons from the levels inside of the gap. A bivalent material such as Mg, Ca, Sr, or Ba release fewer electrons than Hf by two. Accordingly, such a bivalent material becomes a material that accepts two electrons. A trivalent material such as Al, Sc, Y, La, or a lanthanoid releases fewer electrons than Hf by one. As a result, such a trivalent material becomes a material that accepts one electron from the level inside of the gap.

Figure 7:
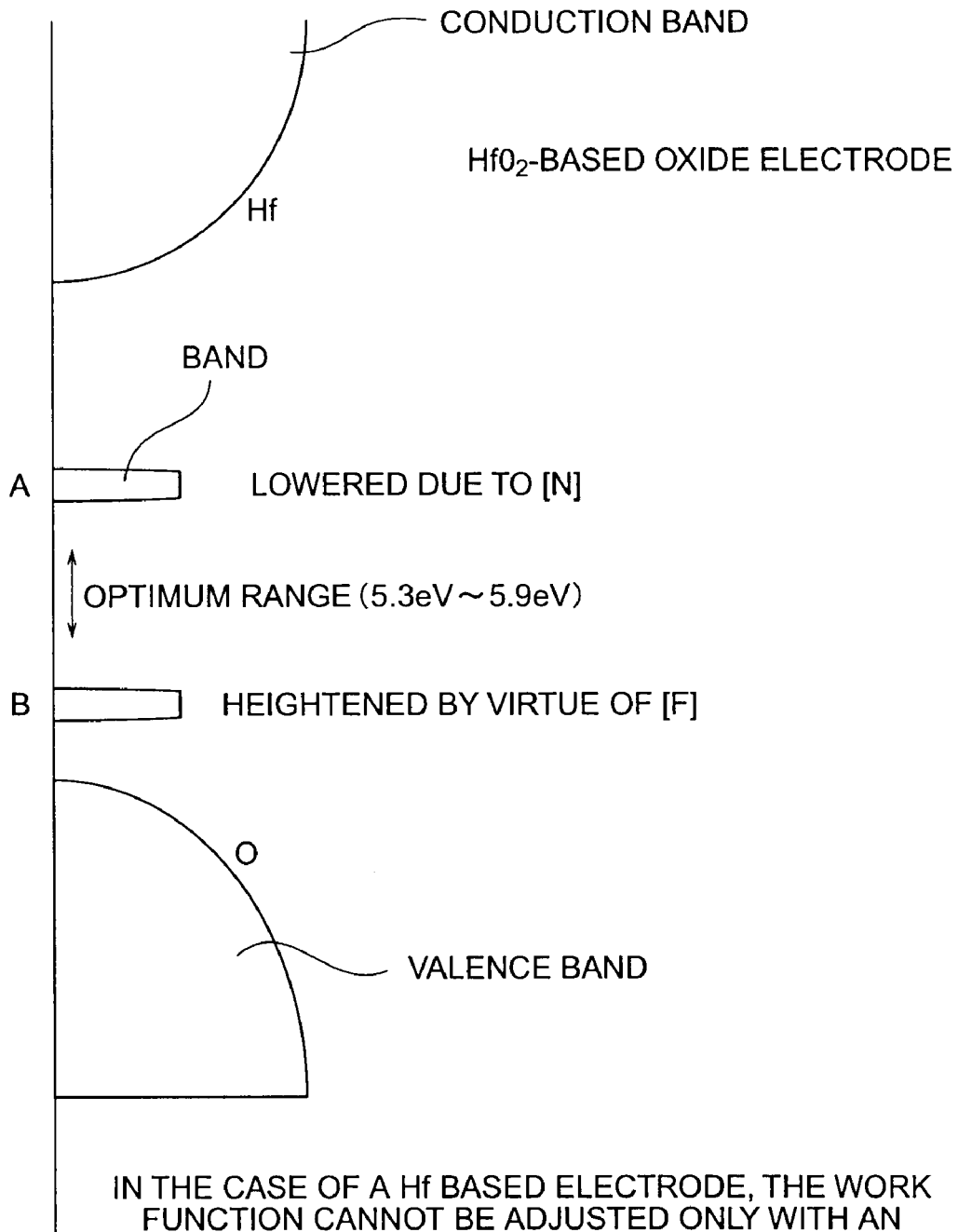
FIG. 7 is a schematic view for explaining the level caused in the gap when a high-valence material N or F is added to $HfO_2$.

So far, the case of the gap inner state A shown in FIG. 7 has been described, with Mo being taken as an example. Mo is added to an oxide, so as to cause a level having a small width (a narrow band) to appear in the gap of the oxide. Nitrogen is further added to the oxide, so that the level with the small width is lowered to fall within the range of the optimum effective work function (5.3 eV to 5.9 eV).

Meanwhile, there might be the case of the gap inner state B shown in FIG. 7. In this case, electrons are injected to the gap inner state B, so as to heighten the level. By doing so, a metal oxide having an optimum work function can be formed. This is because, when electrons are injected, the energy level becomes higher due to the interaction between the electrons. The electron injection can be realized by adding a material that emits electrons (hereinafter also referred to as an electron emissive material) such as fluorine (F) to the oxide. In FIG. 7, the abscissa axis indicates the state density, and the ordinate axis indicates the energy.

Next, the relationship between the amounts of two elements to be added to the oxide film is described. With respect to the amount [α] of an element a selected from the first group consisting of Nb, Mo, W, and Re, the amount [β] of an element β selected from the second group consisting of N, C, B, Mg, Ca, Sr, Ba, Al, Sc, Y, La, Ce, Pr, Nd, Pm, Sm, Eu, Gd, Tb, Dy, Ho, Er, Tm, Yb, and Lu satisfies the following inequation:

$$0.08\times[\alpha]<[\beta]\times K<[\alpha]\times([\text{the number of outermost electrons of the element }\alpha]-4)$$

In the above inequation, K represents the number of electrons the added element β can accept, when the element β is N, K is 1,
when the element β is C, K is 2,
when the element β is B, K is 3,
when the element β is Mg, Ca, Sr, or Ba, K is 2, and
when the element β is Al, Sc, Y, La, Ce, Pr, Nd, Pm, Sm, Eu, Gd, Tb, Dy, Ho, Er, Tm, Yb, or Lu, K is 1.

The number of outermost electrons of the element α is 5 in the case of Nb, 6 in the case of Mo, 6 in the case of W, and 7 in the case of Re. In the above inequation, ([the number of outermost electrons of the element α]−4) is the number of electrons in the gap inner state, and it is impossible to emit a larger amount of electrons than that. Accordingly, the upper limit is determined. The lower limit is considered to be 0.08× [α]<[β]× K. This is because the electron correlation effect does not become apparent unless the amount of electrons in the gap inner state is approximately 1/12=0.083, since there are 12 Hf atom positions around one Hf atom position at a maximum. The effect of electron emission from the gap inner state becomes apparent when electrons fill the Hf atom positions around the one Hf position.

Figure 8:
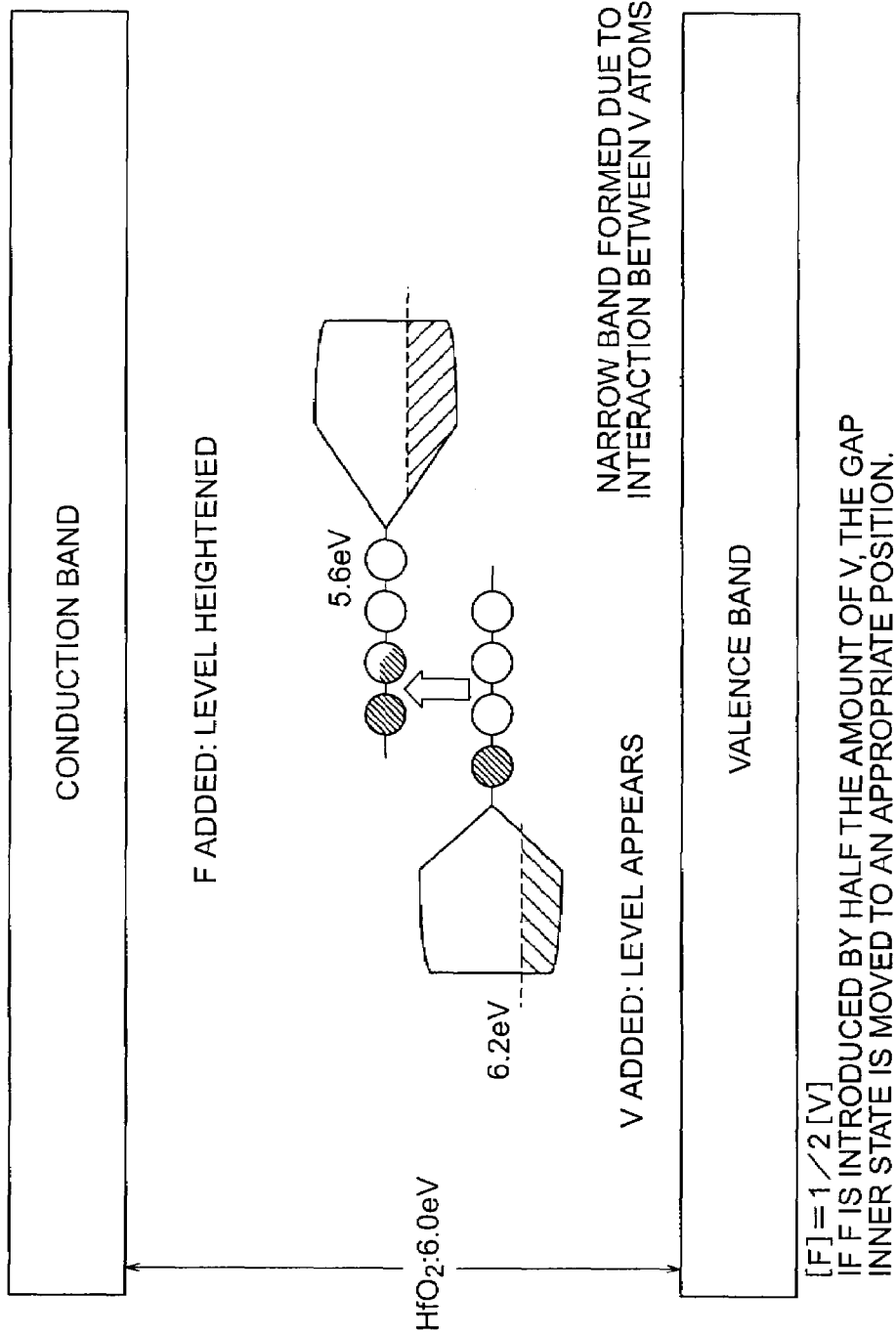
FIG. 8 is a schematic view for explaining the level caused in the gap when a high-valence material V or F is added to $HfO_2$.

FIG. 8 illustrates a situation where vanadium (V) is added to $HfO_2$, so as to cause a level to appear in the gap in $HfO_2$. In this situation, a narrow band is formed in the gap due to the interaction between V additives. The work function is determined to be approximately 6.2 eV by the level. When fluorine (F) is further introduced, electrons can be introduced into the level of V. The introduced fluorine replaces the oxygen. Since fluorine cannot accept electrons as many as oxygen can, there are remaining electrons among the electrons emitted from Hf. The remaining electrons are moved to the level in the gap formed by V, so as to stabilize the $HfO_2$ film. The electrons in the level of V increase accordingly. As a result, the level becomes higher, and a metal oxide having a work function in the neighborhood of 5.6 eV is formed by introducing one fluorine atom for two V atoms, as shown in FIG. 8. To sum up, the work function can be controlled by adjusting the amount of fluorine. The same effect as above can be achieved by adding Cr, Mn, or Tc, instesd of V.

Since the fluorine (F) or hydrogen (H) replacing the oxygen in $HfO_2$ cannot accept electrons as many as oxygen can, some of the electrons released from Hf remain. As a result, the electrons are emitted, and the material is called an electron emissive material. There are only a few electron emissive materials, and the most effective element is fluorine. An element that can be readily introduced is hydrogen. For example, to introduce hydrogen, $HfO_2$ is simply left in low-temperature plasma hydrogen. In an embodiment of the present invention, a Hf oxide or a Zr oxide is used, and the same characteristics as such oxides might be obtained when Ta replaces Hf or Zr. This is because Ta has a larger valence number than Hf and Zr, and can release more electrons than Hf and Zr can. Thus, fluorine, hydrogen, or Ta can be considered as the electron emissive material.

Next, the relative amount of an element selected from the second group consisting of F, H, and Ta with respect to an element selected from the first group consisting of V, Cr, Mn, and Tc is described. With respect to the amount [A] of the element A selected from the first group consisting of V, Cr, Mn, and Tc, the amount [B] of the element B selected from the second group consisting of F, H, and Ta satisfies the following inequation:

$$0.08 \times [A] < [B] < [A] \times (8 - [\text{the number of outermost electrons of the element } A])$$

The number of outermost electrons of the element A is 5 in the case of V, 6 in the case of Cr, 7 in the case of Mn, and 7 in the case of Tc. The relative upper limit value is determined by the fact that (8−[the number of outermost electrons of the element A]) electrons can be injected into the level formed by the element A at a maximum. The lower limit is considered to be $0.08 \times [A] < [B]$. This is because the electron correlation effect does not become apparent unless the amount of electrons is approximately $1/12 = 0.083$, since there are 12 Hf atom positions around one Hf atom position at a maximum. The effect of electron emission from the gap inner state becomes apparent when electrons fill the Hf atom positions around the one Hf atom position.

Figure 9:
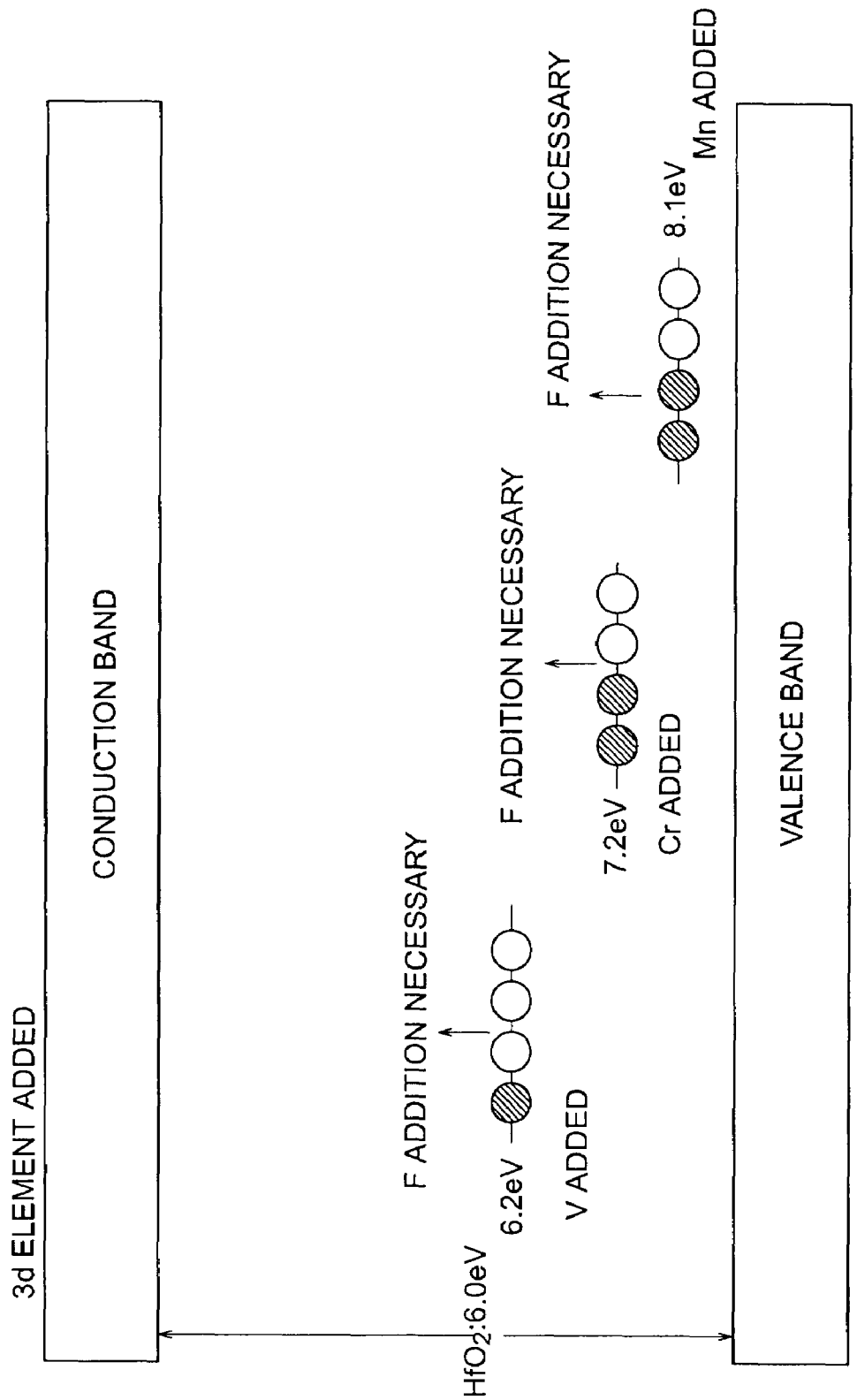
FIG. 9 is a schematic view for explaining the level caused in the gap when a high-valence material having 3d electrons is added to $HfO_2$.
Figure 10:
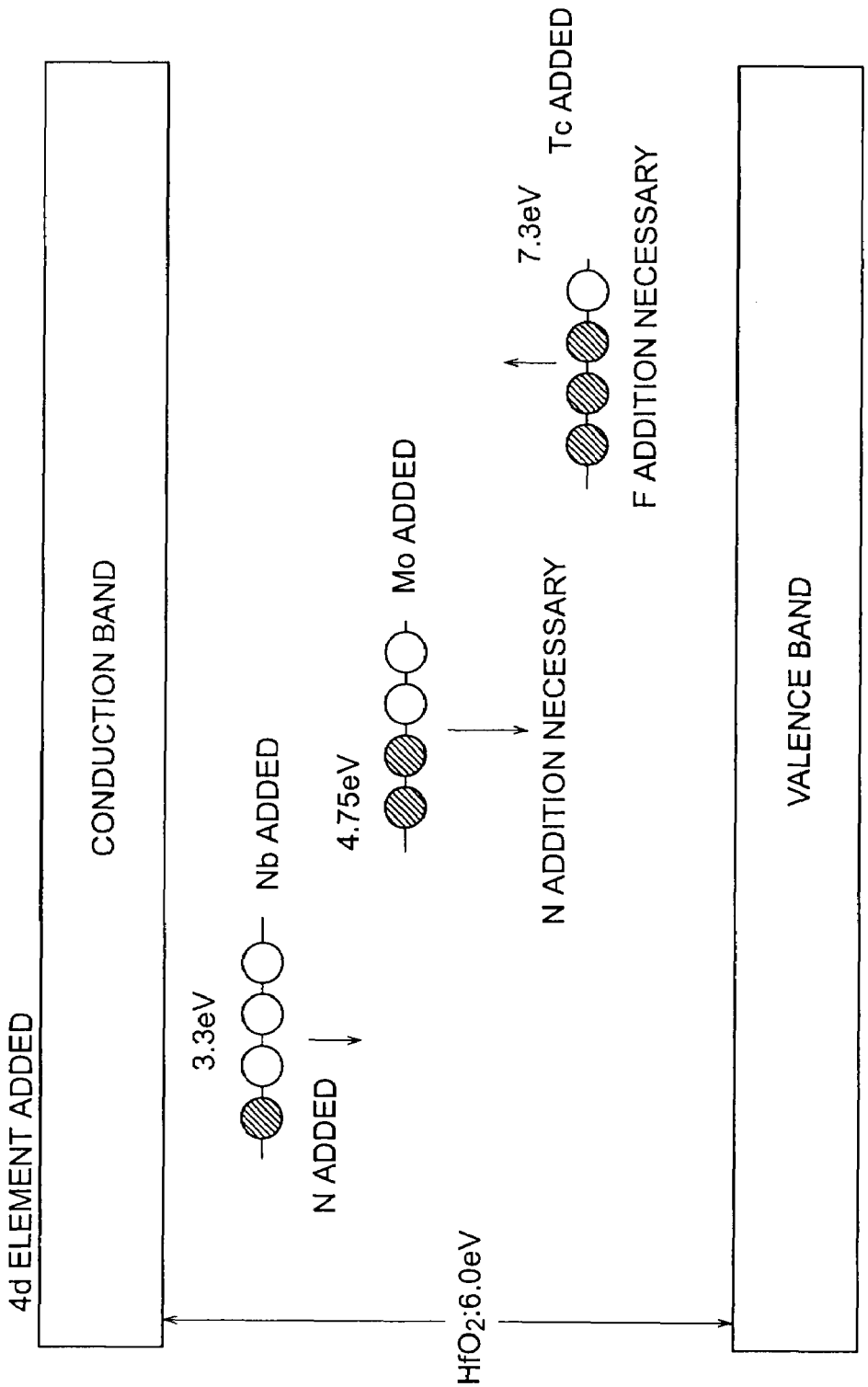
FIG. 10 is a schematic view for explaining the level caused in the gap when a high-valence material having 4d electrons is added to $HfO_2$.
Figure 11:
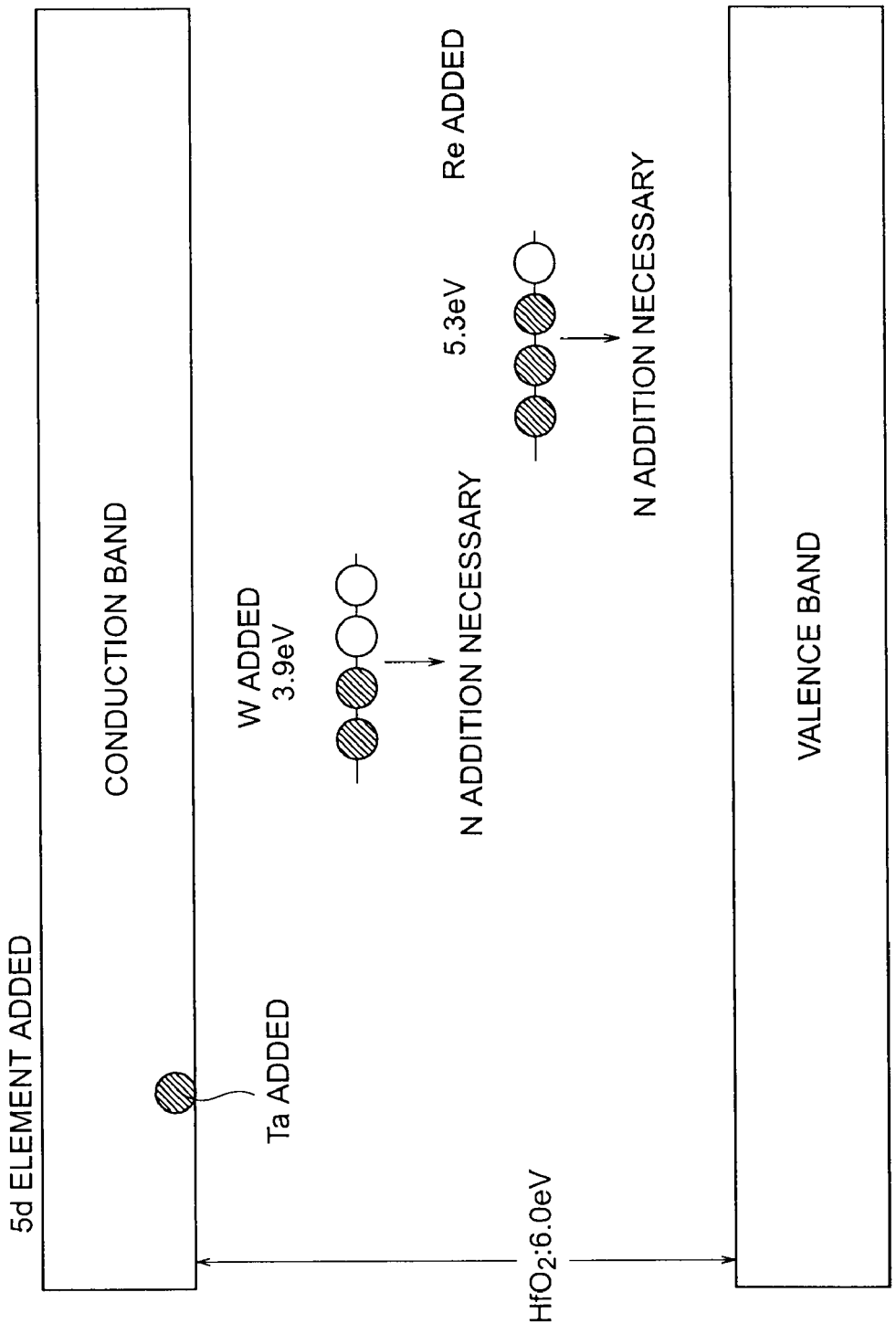
FIG. 11 is a schematic view for explaining the level caused in the gap when a high-valence material having 5d electrons is added to $HfO_2$.

FIGS. 9, 10, and 11 show the levels in the gap in the respective cases where a 3d element (V, Cr, or Mn) is introduced into $HfO_2$, a 4d element (Nb, Mo, or Tc) is introduced into $HfO_2$, and a 5d element (Ta, W, or Re) is introduced into $HfO_2$. As shown in FIG. 9, when V as a 3d element is added, a level appears at 6.2 eV, which is measured from the vacuum level. When Cr is added, a level appears at 7.2 eV, which is measured from the vacuum level. When Mn is added, a level appears at 8.1 eV, which is measured from the vacuum level. Therefore, in a case where one of those elements is added, F, H, or Ta needs to be further added, so as to heighten the level to the range of the optimum effective work function, or move the level toward the vacuum level. As shown in FIG. 10, when Nb as a 4d element is added, a level appears at 3.3 eV. When Mo is added, a level appears at 4.75 eV. When Tc is added, a level appears at 7.3 eV. Therefore, in a case where Nb or Mo is added, N, C, B, Mg, Ca, Sr, Ba, Al, Sc, Y, La, Ce, Pr, Nd, Pm, Sm, Eu, Gd, Tb, Dy, Ho, Er, Tm, Yb, or Lu needs to be further added, so as to lower the level to the range of the optimum effective work function, or move the level away from the vacuum level. In a case where Tc is added, F, H, or Ta needs to be further added, so as to heighten the level to the range of the optimum effective work function. As shown in FIG. 11, when Ta as a 5d element is added, a level appears in the conduction band. When W is added, a level appears at 3.9 eV. When Re is added, a level appears at 5.3 eV. Therefore, in a case where W or Re is added, N, C, B, Mg, Ca, Sr, Ba, Al, Sc, Y, La, Ce, Pr, Nd, Pm, Sm, Eu, Gd, Tb, Dy, Ho, Er, Tm, Yb, or Lu needs to be further added, so as to lower the level to the range of the optimum effective work function.

In the following, more specific examples of the present invention are described.

First Example

Referring now to FIG. 1, a nonvolatile semiconductor memory in accordance with a first example of the present invention is described.

The nonvolatile semiconductor memory of this example includes memory cells that are arranged in a matrix form. FIG. 1 is a cross-sectional view of one of the memory cells. As shown in FIG. 1, each of the memory cells has an n-type source region 2a and an n-type drain region 2b formed at a distance from each other on a p-type silicon substrate 1, for example. The region of the silicon substrate 1 located between the source region 2a and the drain region 2b serves as a channel region 3 that is a current path. A gate 5 for controlling memory operations is provided on the channel region 3. The gate 5 is a stacked structure that includes a tunnel insulating film 6, a charge storage film 7, a charge block film 8, and a control electrode 10 stacked in this order on the channel region 3. FIG. 2 shows the energy band structure of the gate 5.

Next, the respective films forming the gate 5 of each memory cell in accordance with this embodiment are described.

One end of the tunnel insulating film 6 overlaps with part of the source region 2a, and the other end of the tunnel insulating film 6 overlaps with part of the drain region 2b. As the tunnel insulating film 6, it is preferable to use a silicon oxide film with a low dielectric constant, a silicon oxynitride film, or a stack layer consisting of a silicon oxide film and a silicon oxynitride film. The thickness of the tunnel insulating film 6 is in the range of 0.5 nm to 8 nm. Since a film having discrete energy levels is used as the charge storage film 7 in this embodiment, the film thickness of the tunnel insulating film 6 is 2.4 nm. On the other hand, in a memory of a floating-gate type having a charge storage film made of polysilicon, the thickness of the tunnel insulating film 6 cannot be smaller than a certain thickness (approximately 7 nm). Therefore, an 8-nm thick SiON film may be used as the tunnel insulating film 6, for example. In a case where a material having discrete energy levels is used as the charge storage film, the tunnel insulating film 6 can have a film thickness of 5 nm or smaller.

A predetermined voltage is applied to the control electrode 10, so that the electrons passing through the tunnel insulating film 6 are trapped in the charge storage film 7. In this embodiment, the charge storage film 7 is a 4-nm thick silicon nitride film. Other than silicon nitride, it is possible to use a 6-nm thick $SrTiO_3$ film that has a high dielectric constant and has Ru added thereto, for example. The dielectric constant of $SrTiO_3$ is as high as 300. Here, a sputtering technique is utilized for the film formation. More specifically, sputtering is performed simultaneously on a $SrTiO_3$ target and a $SrRuO_3$ target, so that Ru is introduced. Other than that, a high-dielectric film such as a $HfO_2$ film or a HfON film may be used as the charge storage film 7. In a case of a memory of a floating-gate type, it is possible to use phosphorus-doped polysilicon.

As the charge block film 8, a material having a high dielectric constant and large barriers against electrons and holes is suitable. Preferred examples of such materials include hafnia ($HfO_2$), hafnium silicate (HfSiO), hafnium aluminate (HfAlO), lanthanum hafnate ($La_2Hf_2O_7$), yttrium hafnate ($Y_2Hf_2O_7$), strontium hafnate ($SrHfO_3$), zirconia ($ZrO_2$), zirconium silicate (ZrSiO), zirconium aluminate (ZrAlO), lanthanum zirconate ($La_2Zr_2O_7$), yttrium zirconate ($Y_2Zr_2O_7$), strontium zirconate ($SrZrO_3$), and nitrides of those materials. Each of those films is characterized in not causing a serious problem in the film characteristics of each film, when in contact with the Hf oxide film or the Zr oxide film of the present invention. Other examples of preferred materials include $(La_2O_3)_p(Y_2O_3)_q(Al_2O_3)_r(SiO_2)_s$ (p, q, r, and s each being zero or a positive real number) and nitrides of the material. For example, such preferred materials are $LaAlO_3$, $Al_2O_3$, $SiO_2$, SiON, SiN, SiAlON, $LaSiO_5$, LaSiON, (La,Al)$SiO_5$, (La,Al)SiON, and the likes. Each of those films is characterized in not causing a serious problem in the film characteristics of each film when in contact with the Hf oxide film or the Zr oxide film of the present invention, since mutual diffusion is not easily caused between those films. A film made of an oxide or oxynitride of any of the above materials or a stacked structure of some of the above materials can be effectively used as the charge block film 8. Although a 10-nm thick $LaAlO_3$ film is used as the charge block film 8 in this embodiment, a $HfO_2$ film and a HfSiON film were also formed as example block films.

The work function of the control electrode 10 should be sufficiently large, but not too large. More specifically, an optimum work function should be in the range of 5.3 eV to 5.9 eV. In this example, a thin metal film made of $HfO_2$ having Mo and N added thereto was used as the control electrode 10. The film formation of this thin metal film was carried out by performing sputtering simultaneously on a Mo target and a $HfO_2$ target in a mixed gas of Ar, $O_2$, and $N_2$. At this point, the $N_2$ partial pressure was varied so as to obtain an optimum work function. Here, the amount of Mo was approximately $2\times10^{14}$ $cm^{-2}$ in areal density, and the nitrogen concentration was approximately $1\times10^{14}$ $cm^{-2}$ in areal density.

Comparative Example

As a comparative example, a nonvolatile semiconductor memory having a control electrode made of TaN was produced in the same manner as in a conventional case. The same materials as those used in the nonvolatile semiconductor memory of the first example are used in the nonvolatile semiconductor memory of this comparative example, except for the material of the control electrode. It became apparent that the writing speed of the nonvolatile semiconductor memory of this comparative example was not much lower than the writing speed of this example, but the erasing speed of the nonvolatile semiconductor memory of the comparative example was much lower than the erasing speed of this example. This is because the barrier against electrons between the control electrode made of TaN and the charge block film made of $LaAlO_3$, $HfO_2$, or HfSiON is low, and electrons are wrongly written at the time of erasing.

In this example, on the other hand, a metal electrode made of HfON having Mo added thereto is used as the control electrode 10. With such a metal electrode, the barrier against electrons between the control electrode 10 and the charge block film 8 made of $LaAlO_3$, $HfO_2$, or HfSiON becomes very large, and wrong writing is not caused at all. As a result, the erasing speed can be made higher. The erasing speed depends on the amount of nitrogen. Accordingly, as the amount of nitrogen is increased, the erasing speed becomes higher and reaches the saturation point. If the amount of nitrogen is made too large, however, the barrier against holes becomes too low, and the writing speed becomes low accordingly. To sum up, there is an optimum amount of nitrogen, which is almost half the doping amount of Mo.

As described above, in accordance with this example, high-speed writing and high-speed erasing can be performed.

(First Modification)

Figure 12:
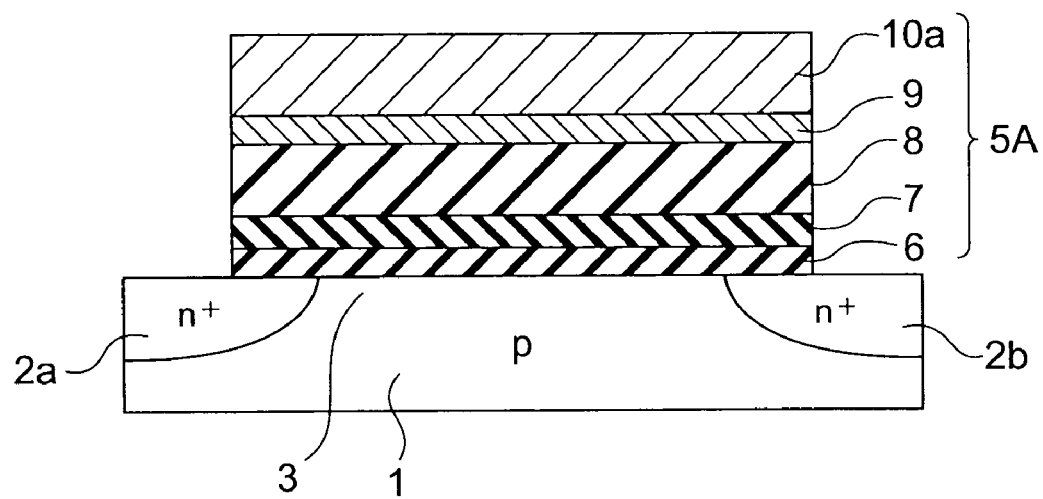
FIG. 12 is a cross-sectional view of a memory cell according to a first modification of a first example.

Referring now to FIG. 12, a nonvolatile semiconductor memory in accordance with a first modification of the first example is described. The nonvolatile semiconductor memory of this modification includes memory cells that are arranged in a matrix form. FIG. 12 is a cross-sectional view of one of the memory cells. Each of the memory cells of this modification is the same as the memory cell of the first example shown in FIG. 1, except that a control electrode 10*a* made of TaN is used in place of the control electrode 10, and an interfacial control film 9 is provided between the control electrode 10*a* and a charge block film 8. This interfacial control film 9 is a thin metal film made of $HfO_2$ having Mo and N added thereto. Accordingly, this memory cell has a gate 5A formed on the channel region 3, and the gate 5A is a stacked structure that includes a tunnel insulating film 6 made of $SiO_2$, a charge storage film 7 made of SiN, the charge block film 8 made of $LaAlO_3$, $HfO_2$, or HfSiON, the interfacial control film 9 made of $HfO_2$ made of Mo and N added thereto, and the control electrode 10*a* made of TaN stacked in this order. The interfacial control film 9 is formed in the following manner. A 5-nm thick $HfO_2$ film to which Mo and N are simultaneously added is formed on the charge block film 8 made of $LaAlO_3$, $HfO_2$, or HfSiON. The control electrode 10*a* made of TaN is then formed. The amount of Mo and the amount of nitrogen are the same as those used to form the control electrode 10 in the first embodiment. To be more specific, the amount of Mo is approximately $2\times10^{14}$ $cm^{-2}$ in areal density, and the amount of nitrogen is approximately $1\times10^{14}$ $cm^{-2}$ in areal density. It was found that, in this modification, wrong writing is not caused, and the erasing speed can be made higher accordingly, as in the first example.

The interfacial control film 9 has a large interfacial state induced in a position of b 5.6 eV from the vacuum level at the interface between TaN and $LaAlO_3$, $HfO_2$, or HfSiON. The Fermi level is pinned in the interfacial state. Unlike the comparative example, this modification does not cause wrong writing at all, though a TaN electrode is used as in the comparative example. Unlike the first example, the first modification can employ a control electrode made of TaN, which has been conventionally used. This aspect is an advantage of the first modification that involves the interfacial state.

In the first example, the control electrode 10 is a single film made of $HfO_2$ having Mo and N added thereto. However, the control electrode 10 may be regarded as a stacked structure consisting of a first film made of $HfO_2$ having Mo and N added thereto for interfacial control, and a second film made of $HfO_2$ having Mo and N added thereto. The control electrode 10*a* of this modification may be considered to have the first film and a TaN film as the second film.

As described above, in accordance with this modification, high-speed writing and high-speed erasing can be performed.

(Second Modification)

Figure 13:
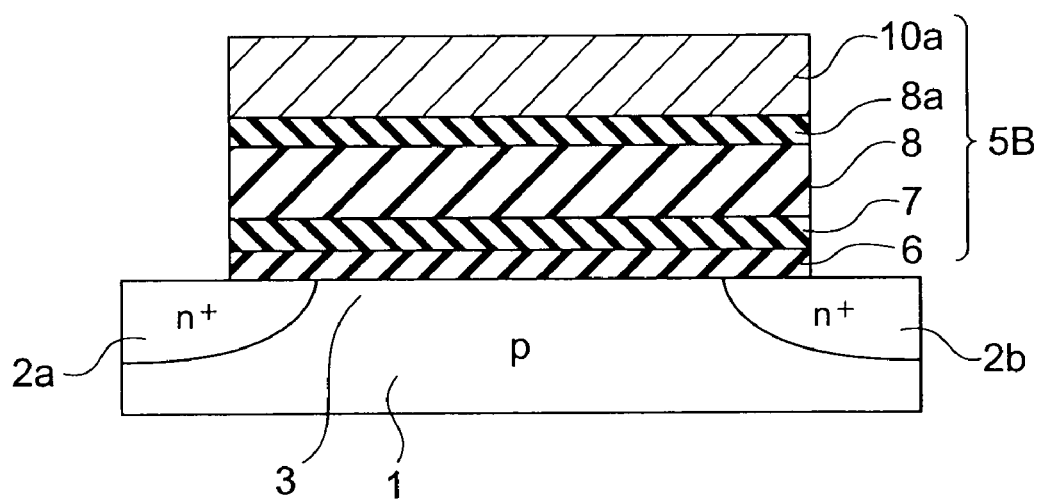
FIG. 13 is a cross-sectional view of a memory cell according to a second modification of the first example.

Referring now to FIG. 13, a nonvolatile semiconductor memory in accordance with a second modification of the first example is described. The nonvolatile semiconductor memory of this modification includes memory cells that are arranged in a matrix form. FIG. 13 is a cross-sectional view of one of the memory cells. Each of the memory cells of this modification is the same as the memory cell of the first example shown in FIG. 1, except that a control electrode 10*a* made of TaN is used in place of the control electrode 10, and a charge block film 8*a* with a modified outermost surface is provided between the control electrode 10*a* and the charge block film 8. Accordingly, this memory cell has a gate 5B formed on the channel region 3, and the gate 5B is a stacked structure that includes a tunnel insulating film 6 made of SiO$_2$, a charge storage film 7 made of SiN, the charge block film 8 made of LaAlO$_3$, HfO$_2$, or HfSiON, the charge block film 8a, and the control electrode 10a made of TaN stacked in this order.

The charge block film 8a is formed in the following manner. A 4-nm thick HfO$_2$ film is formed on the charge block film 8 made of LaAlO$_3$, HfO$_2$, or HfSiON, and a Mo film is formed by sputtering in a nitrogen atmosphere. By carrying out heat treatment, the charge block film 8a having Mo and nitrogen diffused into the 2-nm upper region the HfO$_2$ film is formed. The amount of Mo is approximately $4\times10^{13}$ cm$^{-2}$ in areal density, and the amount of nitrogen is approximately $2\times10^{13}$ cm$^{-2}$ in areal density. Since the amount of Mo is smaller than that in the first modification, the HfO$_2$ film 8a is not turned into a metal film. At the interface between the charge block film 8a and the control electrode 10a, an interfacial state is artificially distributed within the gap in the charge block film 8a. With the combinations of materials disclosed in this modification, the energy position of this interfacial state is 5.6 eV from the vacuum level. Accordingly, the effective work function of the control electrode 10a can be fixed at the set value of 5.6 eV. In this modification, the charge block film 8a is also referred to as an interfacial control oxide film. In this modification, wrong writing is not caused at all as in the first example, and the erasing speed can be made higher accordingly.

Unlike the first example, this modification has an interfacial control oxide film as a charge block film, and the control electrode made of TaN with a work function that is not very large. Accordingly, by modifying the interface between the charge block film 8a and the control electrode 10a, TaN, which has been conventionally used as a control electrode having a not-so-large work function, can be turned into a control electrode having a large effective work function.

As described above, in accordance with this modification, high-speed writing and high-speed erasing can be performed.

In the first example and the first and second modifications, atmospheric nitrogen is used when N is added. However, N may be introduced into the substrate or the like in advance, and heat treatment may be carried out, so as to introduce N into the interface between the charge block film and the control electrode. There is a gap inner state in the interfacial control film and the interfacial control oxide film in the first and second modifications, and electrons can be extracted from the gap inner state. The energy state can be stabilized by moving electrons from the gap inner state. In this manner, N can be stably added to the interfacial control film and the HfO$_2$ thin film having a metal added thereto.

Second Example

Figure 14:
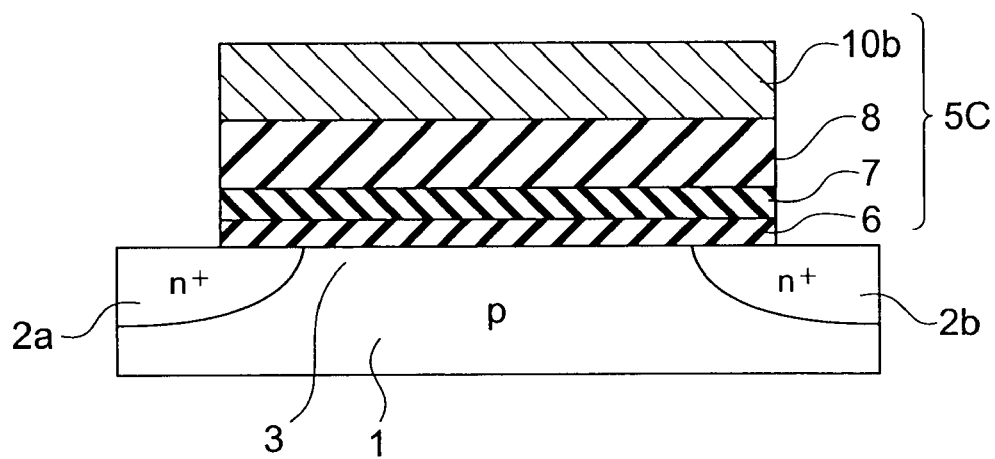
FIG. 14 is a cross-sectional view of a memory cell according to a second example.

Referring now to FIG. 14, a nonvolatile semiconductor memory in accordance with a second example of the present invention is described. The nonvolatile semiconductor memory of this example includes memory cells that are arranged in a matrix form. FIG. 14 is a cross-sectional view of one of the memory cells. Each of the memory cells of this example has exactly the same structure as the memory cell of the first example shown in FIG. 1, except for the control electrode. More specifically, as shown in FIG. 14, each of the memory cells has an n-type source region 2a and an n-type drain region 2b formed at a distance from each other on a p-type silicon substrate 1, for example. The region of the silicon substrate 1 located between the source region 2a and the drain region 2b serves as a channel region 3 that is a current path. A gate 5C for controlling memory operations is provided on the channel region 3. The gate 5C is a stacked structure that includes a tunnel insulating film 6, a charge storage film 7, a charge block film 8, and a control electrode 10b stacked in this order on the channel region 3. FIG. 2 shows the energy band structure of the gate 5C.

The work function of the control electrode 10b of this example should be sufficiently large, but not too large. More specifically, an optimum work function should be in the range of 5.3 eV to 5.9 eV. In this example, a thin metal film made of HfO$_2$ having V and Ta added thereto was used as the control electrode 10b. The film formation of this thin metal film was carried out by performing sputtering simultaneously on three targets of a V target, a Ta target, and a HfO$_2$ target in a mixed gas of Ar and O$_2$. At this point, the power supplied to the V target and the Ta target was varied so as to obtain an optimum work function. Here, the amount of V was approximately $2\times10^{14}$ cm$^{-2}$ in areal density, and the amount of Ta was approximately $1\times10^{14}$ cm$^{-2}$ in areal density.

The comparative example of the first example having a TaN film as the control electrode was much poorer in erasing speed than the first example. This is because the barrier against electrons between the control electrode made of TaN and the charge block film made of LaAlO$_3$, HfO$_2$, or HfSiON is low, and electrons are wrongly written at the time of erasing, as mentioned above.

In the second example, on the other hand, a thin metal film made of HfO$_2$ having V and Ta added thereto is used as the control electrode 10b. With such a metal electrode, the barrier against electrons between the control electrode 10b and the charge block film 8 made of LaAlO$_3$, HfO$_2$, or HfSiON becomes very large, and wrong writing is not caused at all. As a result, the erasing speed can be made higher. The erasing speed depends on the amount of Ta. Accordingly, as the amount of Ta is reduced, the erasing speed becomes higher and reaches the saturation point. If the amount of Ta is made too small, however, the barrier against holes becomes too low, and the writing speed becomes low accordingly. To sum up, there is an optimum amount of Ta, which is almost half the doping amount of V.

As described above, in accordance with this example, high-speed writing and high-speed erasing can be performed.

(First Modification)

Figure 15:
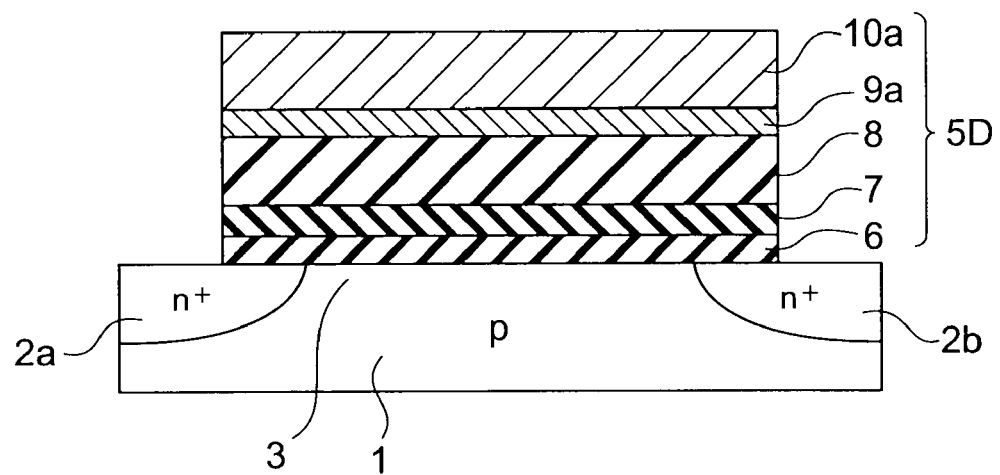
FIG. 15 is a cross-sectional view of a memory cell according to a first modification of the second example.

Referring now to FIG. 15, a nonvolatile semiconductor memory in accordance with a first modification of the second example is described. The nonvolatile semiconductor memory of this modification includes memory cells that are arranged in a matrix form. FIG. 15 is a cross-sectional view of one of the memory cells. Each of the memory cells of this modification is the same as the memory cell of the second example shown in FIG. 14, except that a control electrode 10a made of TaN is used as the control electrode, and an interfacial control film 9a is provided between the control electrode 10a and a charge block film 8. This interfacial control film 9a is a thin film made of HfO$_2$ having V and Ta added thereto. Accordingly, this memory cell has a gate 5D formed on the channel region 3, and the gate 5D is a stacked structure that includes a tunnel insulating film 6 made of SiO$_2$, a charge storage film 7 made of SiN, the charge block film 8 made of LaAlO$_3$, HfO$_2$, or HfSiON, the interfacial control film 9a made of HfO$_2$ made of V and Ta added thereto, and the control electrode 10a made of TaN stacked in this order.

The interfacial control film 9a is formed in the following manner. A 5-nm thick HfO$_2$ thin film to which V and Ta are added is formed on the charge block film 8 made of LaAlO$_3$, HfO$_2$, or HfSiON. The control electrode 10*a* made of TaN is then formed. The amount of V and the amount of Ta are the same as those used in the second example. To be more specific, the amount of V is approximately $2\times10^{14}$ cm$^{-2}$ in areal density, and the amount of Ta is approximately $1\times10^{14}$ cm$^{-2}$ in areal density. It was found that, in this modification, wrong writing is not caused, and the erasing speed can be made higher accordingly, as in the second example. This interfacial control film 9*a* has a large interfacial state induced in a position of 5.6 eV from the vacuum level at the interface between the control electrode 10*a* made of TaN and the charge block film 8 made of LaAlO$_3$, HfO$_2$, or HfSiON. The Fermi level is pinned in the interfacial state. Unlike the comparative example of the first example, this modification does not cause wrong writing at all, despite the use of a TaN electrode. Unlike the second example, this modification can employ a control electrode made of TaN, which has been conventionally used. This aspect is an advantage of this modification that involves the interfacial state.

As described above, in accordance with this modification, high-speed writing and high-speed erasing can be performed.

(Second Modification)

Figure 16:
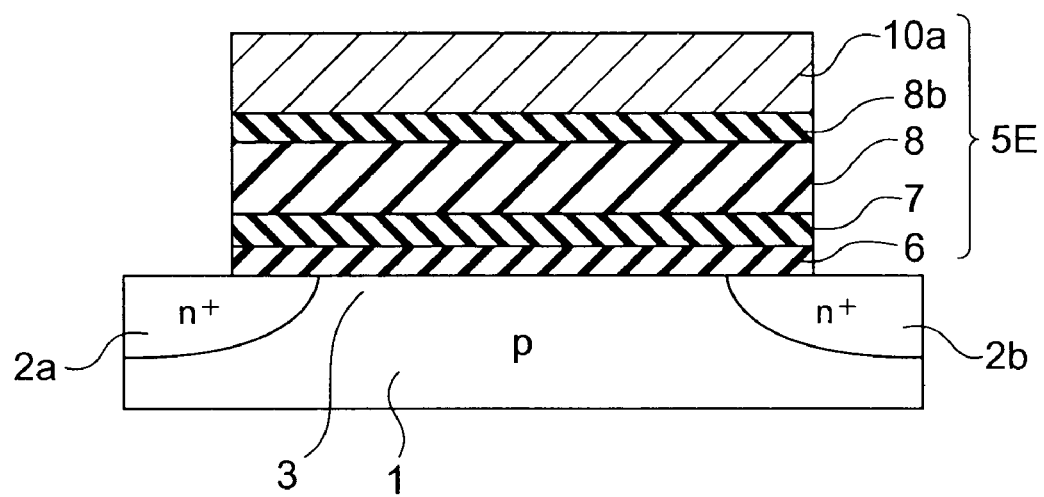
FIG. 16 is a cross-sectional view of a memory cell according to a second modification of the second example.

Referring now to FIG. 16, a nonvolatile semiconductor memory in accordance with a second modification of the second example is described. The nonvolatile semiconductor memory of this modification includes memory cells that are arranged in a matrix form. FIG. 16 is a cross-sectional view of one of the memory cells. Each of the memory cells of this modification is the same as the memory cell of the second example shown in FIG. 14, except that a control electrode 10*a* made of TaN is used as the control electrode, and a charge block film 8*b* with a modified outermost surface is provided between the control electrode 10*a* and the charge block film 8. Accordingly, this memory cell has a gate 5E formed on the channel region 3, and the gate 5E is a stacked structure that includes a tunnel insulating film 6 made of SiO$_2$, a charge storage film 7 made of SiN, the charge block film 8 made of LaAlO$_3$, HfO$_2$, or HfSiON, the charge block film 8*b*, and the control electrode 10*a* made of TaN stacked in this order.

The charge block film 8*b* is formed in the following manner. A 4-nm thick HfO$_2$ film is formed on the charge block film 8 made of LaAlO$_3$, HfO$_2$, or HfSiON, and a V film and a Ta film are formed by sputtering. By carrying out heat treatment, the charge block film 8*b* having V and Ta diffused into the 2-nm upper region of the HfO$_2$ film is formed. The amount of V is approximately $2\times10^{13}$ cm$^{-2}$ in areal density, and the amount of Ta is approximately $1\times10^{13}$ cm$^{-2}$ in areal density. Since the amount of V is smaller than that in the second example, the HfO$_2$ film 8*b* having V and Ta added thereto is not turned into a metal film. At the interface between the charge block film 8 and the control electrode 10*a*, an interfacial state is artificially distributed within the gap in the charge block film 8. With the combinations of materials disclosed in this modification, the energy position of this interfacial state is 5.6 eV from the vacuum level. Accordingly, the effective work function of the control electrode 10*a* can be fixed at the set value of 5.6 eV. In this modification, the charge block film 8*b* is also referred to as an interfacial control oxide film, as in the second modification of the first example. In this modification, wrong writing is not caused at all as in the second example, and the erasing speed can be made higher accordingly.

Unlike the second example, this modification has the interfacial control oxide film 8*b* as a charge block film, and the control electrode 10*a* made of TaN with a work function that is not very large. Accordingly, by modifying the interface between the charge block film and the control electrode, TaN, which has been conventionally used as a control electrode, can be turned into a control electrode having a large effective work function.

As described above, in accordance with this modification, high-speed writing and high-speed erasing can be performed.

Third Example

Figure 17:
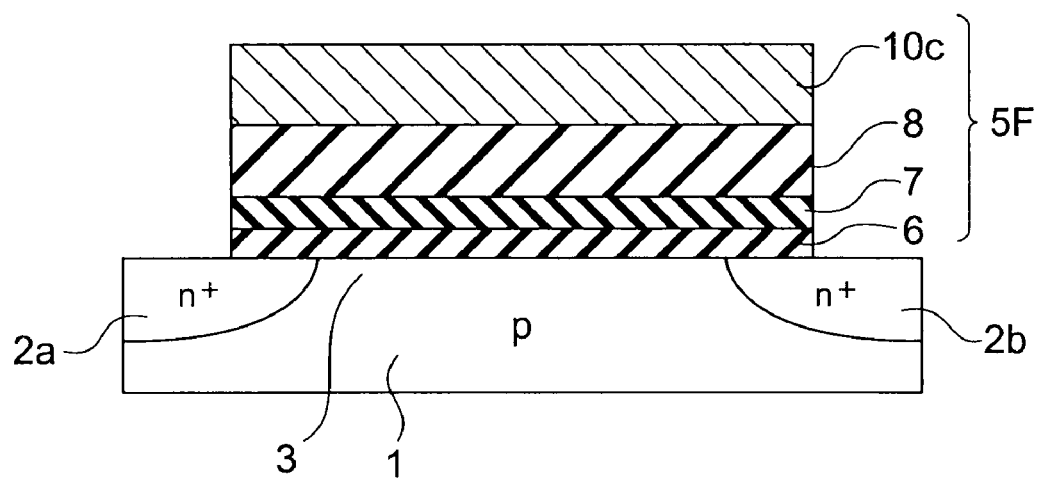
FIG. 17 is a cross-sectional view of a memory cell according to a third example.

Referring now to FIG. 17, a nonvolatile semiconductor memory in accordance with a third example of the present invention is described. The nonvolatile semiconductor memory of this example includes memory cells that are arranged in a matrix form. FIG. 17 is a cross-sectional view of one of the memory cells. Each of the memory cells of this example has exactly the same structure as the memory cell of the first example shown in FIG. 1, except for the control electrode. More specifically, as shown in FIG. 17, each of the memory cells has an n-type source region 2*a* and an n-type drain region 2*b* formed at a distance from each other on a p-type silicon substrate 1, for example. The region of the silicon substrate 1 located between the source region 2*a* and the drain region 2*b* serves as a channel region 3 that is a current path. A gate 5F for controlling memory operations is provided on the channel region 3. The gate 5F is a stacked structure that includes a tunnel insulating film 6, a charge storage film 7, a charge block film 8, and a control electrode 10*c* stacked in this order on the channel region 3. FIG. 2 shows the energy band structure of the gate 5F.

The work function of the control electrode 10*c* should be sufficiently large, but not too large. More specifically, an optimum work function should be in the range of 5.3 eV to 5.9 eV. In this embodiment, a thin metal film made of HfO$_2$ having Cr and F added thereto is used as the control electrode 10*c*. The film formation of this thin metal film was carried out by performing sputtering simultaneously on two targets of a Cr target and a HfO$_2$ target in a mixed gas of Ar and CF$_3$. At this point, the power supplied to the Cr target was varied so as to obtain an optimum work function. Here, the amount of Cr was approximately $1.5\times10^{14}$ cm$^{-2}$ in areal density, and the concentration of F was approximately $1.0\times10^{14}$ cm$^{-2}$ in areal density.

The comparative example of the first example having a TaN film as the control electrode was much poorer in erasing speed than the first example. This is because the barrier against electrons between the control electrode made of TaN and the charge block film made of LaAlO$_3$, HfO$_2$, or HfSiON is low, and electrons are wrongly written at the time of erasing, as mentioned above.

In the third example, on the other hand, a thin metal film made of HfO$_2$ having Cr and F added thereto is used as the control electrode 10*c*. With such a metal electrode, the barrier against electrons between the control electrode 10*c* and the charge block film 8 made of LaAlO$_3$, HfO$_2$, or HfSiON becomes very large, and wrong writing is not caused at all. As a result, the erasing speed can be made higher. The erasing speed depends on the amount of F. Accordingly, as the amount of F is reduced, the erasing speed becomes higher and reaches the saturation point. If the amount of F is made too small, however, the barrier against holes becomes too low, and the writing speed becomes low accordingly. To sum up, there is an optimum amount of F, which is almost 67% of the doping amount of Cr.

(First Modification)

Figure 18:
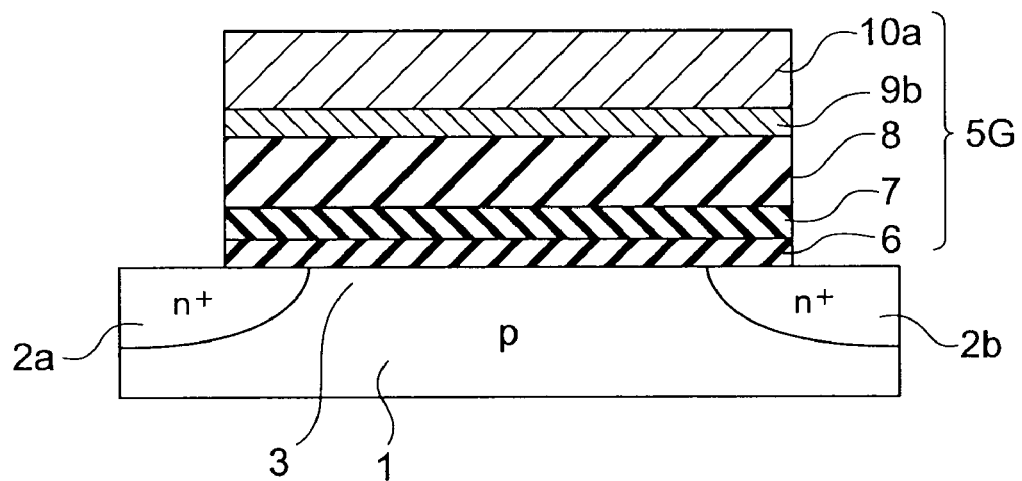
FIG. 18 is a cross-sectional view of a memory cell according to a first modification of the third example.

Referring now to FIG. 18, a nonvolatile semiconductor memory in accordance with a first modification of the third example is described. The nonvolatile semiconductor memory of this modification includes memory cells that are arranged in a matrix form. FIG. 18 is a cross-sectional view of one of the memory cells. Each of the memory cells of this modification is the same as the memory cell of the third example shown in FIG. 17, except that a control electrode 10a made of TaN is used as the control electrode, and an interfacial control film 9b is provided between the control electrode 10a and a charge block film 8. This interfacial control film 9b is a thin metal film made of $HfO_2$ having Cr and F added thereto. Accordingly, this memory cell has a gate 5G formed on the channel region 3, and the gate 5G is a stacked structure that includes a tunnel insulating film 6 made of $SiO_2$, a charge storage film 7 made of SiN, the charge block film 8 made of $LaAlO_3$, $HfO_2$, or HfSiON, the interfacial control film 9b made of $HfO_2$ made of Cr and F added thereto, and the control electrode 10a made of TaN stacked in this order.

The interfacial control film 9b is formed in the following manner. A 5-nm thick $HfO_2$ thin film 9b to which Cr and F are added is formed on the charge block film 8 made of $LaAlO_3$, $HfO_2$, or HfSiON. The control electrode 10a made of TaN is then formed. The amount of Cr and the amount of F are the same as those used in the third embodiment. To be more specific, the amount of Cr is approximately $1.5 \times 10^{14}$ $cm^{-2}$ in areal density, and the amount of F is approximately $1.0 \times 10^{14}$ $cm^{-2}$ in areal density. It was found that, in this modification, wrong writing is not caused, and the erasing speed can be made higher accordingly, as in the third example. This interfacial control film 9b has a large interfacial state induced in a position of 5.6 eV from the vacuum level at the interface between the control electrode 10a made of TaN and the charge block film 8 made of $LaAlO_3$, $HfO_2$, or HfSiON. The Fermi level is pinned in the interfacial state. Unlike the comparative example of the first example, this modification does not cause wrong writing at all, despite the use of a TaN electrode. Unlike the third example, this modification can employ a control electrode made of TaN, which has been conventionally used. This aspect is an advantage of this modification that involves the interfacial state.

As described above, in accordance with this modification, high-speed writing and high-speed erasing can be performed.

(Second Modification)

Figure 19:
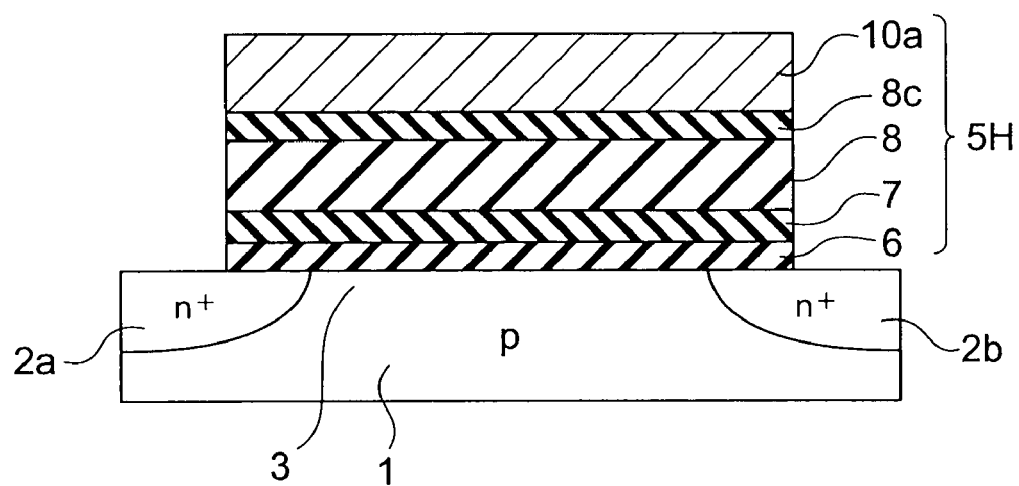
FIG. 19 is a cross-sectional view of a memory cell according to a second modification of the third example.

Referring now to FIG. 19, a nonvolatile semiconductor memory in accordance with a second modification of the third example is described. The nonvolatile semiconductor memory of this modification includes memory cells that are arranged in a matrix form. FIG. 19 is a cross-sectional view of one of the memory cells. Each of the memory cells of this modification is the same as the memory cell of the third example shown in FIG. 17, except that a control electrode 10a made of TaN is used as the control electrode, and a charge block film 8c with a modified outermost surface is provided between the control electrode 10a and the charge block film 8. Accordingly, this memory cell has a gate 5H formed on the channel region 3, and the gate 5H is a stacked structure that includes a tunnel insulating film 6 made of $SiO_2$, a charge storage film 7 made of SiN, the charge block film 8 made of $LaAlO_3$, $HfO_2$, or HfSiON, the charge block film 8c, and the control electrode 10a made of TaN stacked in this order.

The charge block film 8c is formed in the following manner. A 4-nm thick $HfO_2$ film is formed on the charge block film 8 made of $LaAlO_3$, $HfO_2$, or HfSiON, and a Cr metal film is formed by sputtering. By carrying out heat treatment in a $CF_4$ atmosphere, the charge block film 8c having Cr and F diffused into the 2-nm upper region of the $HfO_2$ film is formed. The amount of Cr is approximately $1.5 \times 10^{13}$ $cm^{-2}$ in areal density, and the amount of F is approximately $1.0 \times 10^{13}$ $cm^{-2}$ in areal density. Since the amount of Cr is smaller than that in the third example, the $HfO_2$ film is not turned into a metal film. At the interface between the charge block film 8 and the control electrode 10a, an interfacial state is artificially distributed within the gap in the charge block film 8. With the combinations of materials disclosed in this modification, the energy position of this interfacial state is 5.6 eV from the vacuum level. Accordingly, the effective work function of the control electrode 10a can be fixed at the set value of 5.6 eV. In this modification, the charge block film 8c is also referred to as an interfacial control oxide film, as in the second modification of the first example. In this modification, wrong writing is not caused at all as in the third embodiment, and the erasing speed can be made higher accordingly.

Unlike the third example, this modification has the interfacial control oxide film 8c as a charge block film, and a control electrode 10 made of TaN with a work function that is not very large. Accordingly, by modifying the interface between the charge block film and the control electrode, TaN, which has been conventionally used as a control electrode, can be turned into a control electrode having a large effective work function.

As described above, in accordance with this modification, high-speed writing and high-speed erasing can be performed.

In the third example and its modifications, a $CF_4$ gas is used to add F during the film formation. However, it is also possible to use a $PF_4$ gas, a $F_2$ gas, plasma F, or the like. Also, F may be introduced into the substrate, the side walls, and the gate electrode in advance by a simultaneous sputtering technique or an ion injection technique, so that F is introduced into the interface control film or the interfacial control oxide film through heat treatment. There is a gap inner state in the interfacial control film and the interfacial control oxide film in the first and second modifications of the third example, and electrons can be accepted in the gap inner state. The energy state can be stabilized by moving electrons to the gap inner state. In this manner, F can be stably added to the interfacial control film and the $HfO_2$ thin film having a metal added thereto.

Fourth Embodiment

Figure 20:
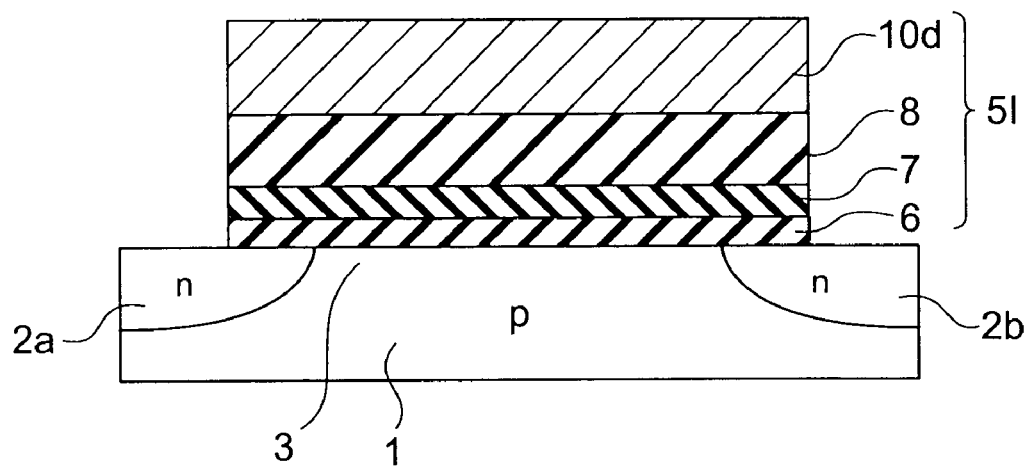
FIG. 20 is a cross-sectional view of a memory cell according to a fourth example.

Referring now to FIG. 20, a nonvolatile semiconductor memory in accordance with a fourth example of the present invention is described. The nonvolatile semiconductor memory of this example includes memory cells that are arranged in a matrix form. FIG. 20 is a cross-sectional view of one of the memory cells. Each of the memory cells of this example has exactly the same structure as the memory cell of the first example shown in FIG. 1, except for the control electrode. More specifically, as shown in FIG. 20, each of the memory cells has an n-type source region 2a and an n-type drain region 2b formed at a distance from each other on a p-type silicon substrate 1, for example. The region of the silicon substrate 1 located between the source region 2a and the drain region 2b serves as a channel region 3 that is a current path. A gate 5I for controlling memory operations is provided on the channel region 3. The gate 5I is a stacked structure that includes a tunnel insulating film 6, a charge storage film 7, a charge block film 8, and a control electrode 10d stacked in this order on the channel region 3. FIG. 2 shows the energy band structure of the gate 5I.

The work function of the control electrode 10d should be sufficiently large, but not too large. More specifically, an optimum work function should be in the range of 5.3 eV to 5.9 eV. In this embodiment, a thin metal film made of $HfO_2$ having Mn and H added thereto is used as the control electrode 10c. The film formation of this thin metal film was carried out by performing sputtering simultaneously on two targets of a Mn target and a HfO$_2$ target in a mixed gas of Ar and H$_2$. At this point, the power supplied to the Mn target was varied so as to obtain an optimum work function. Here, the amount of Mn was approximately $2.0 \times 10^{14}$ cm$^{-2}$ in areal density, and the concentration of H was approximately $1.5 \times 10^{14}$ cm$^{-2}$ in areal density.

The comparative example of the first example having a TaN film as the control electrode was much poorer in erasing speed than the first example. This is because the barrier against electrons between the control electrode made of TaN and the charge block film made of LaAlO$_3$, HfO$_2$, or HfSiON is low, and electrons are wrongly written at the time of erasing, as mentioned above.

In the fourth example, on the other hand, a thin metal film made of HfO$_2$ having Mn and H added thereto is used as the control electrode 10d. With such a metal electrode, the barrier against electrons between the control electrode 10d and the charge block film 8 made of LaAlO$_3$, HfO$_2$, or HfSiON becomes very large, and wrong writing is not caused at all. As a result, the erasing speed can be made higher. The erasing speed depends on the amount of H. Accordingly, as the amount of H is reduced, the erasing speed becomes higher and reaches the saturation point. If the amount of H is made too small, however, the barrier against holes becomes too low, and the writing speed becomes low accordingly. To sum up, there is an optimum amount of H, which is almost 75% of the doping amount of Mn.

(First Modification)

Figure 21:
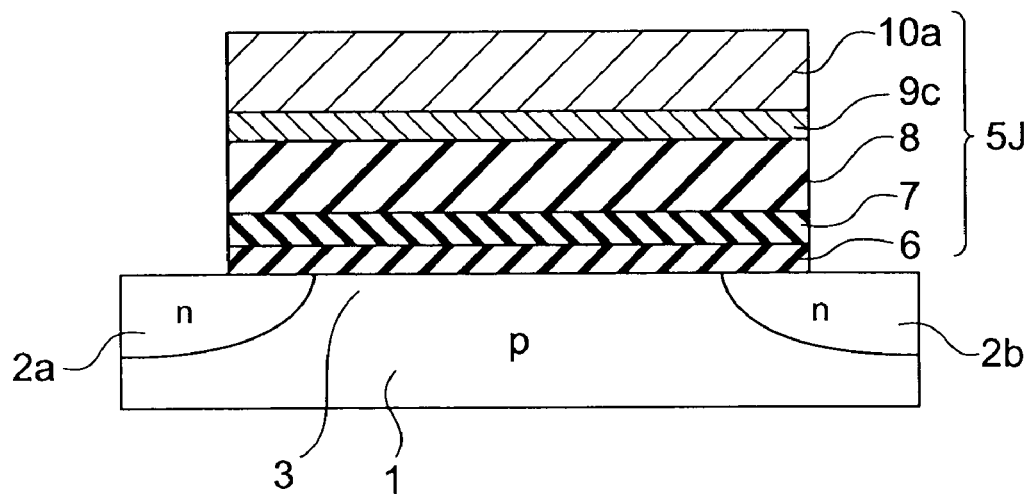
FIG. 21 is a cross-sectional view of a memory cell according to a first modification of the fourth example.

Referring now to FIG. 21, a nonvolatile semiconductor memory in accordance with a first modification of the fourth example is described. The nonvolatile semiconductor memory of this modification includes memory cells that are arranged in a matrix form. FIG. 21 is a cross-sectional view of one of the memory cells. Each of the memory cells of this modification is the same as the memory cell of the fourth example shown in FIG. 20, except that a control electrode 10a made of TaN is used as the control electrode, and an interfacial control film 9c is provided between the control electrode 10a and a charge block film 8. This interfacial control film 9c is a thin metal film made of HfO$_2$ having Mn and H added thereto. Accordingly, this memory cell has a gate 5J formed on the channel region 3, and the gate 5J is a stacked structure that includes a tunnel insulating film 6 made of SiO$_2$, a charge storage film 7 made of SiN, the charge block film 8 made of LaAlO$_3$, HfO$_2$, or HfSiON, the interfacial control film 9c made of HfO$_2$ made of Mn and H added thereto, and the control electrode 10a made of TaN stacked in this order.

The interfacial control film 9c is formed in the following manner. A 5-nm thick HfO$_2$ thin film 9c to which Mn and H are added is formed on the charge block film 8 made of LaAlO$_3$, HfO$_2$, or HfSiON. The control electrode 10a made of TaN is then formed. The amount of Mn and the amount of H are the same as those used in the fourth example. To be more specific, the amount of Mn is approximately $2.0 \times 10^{14}$ cm$^{-2}$ in areal density, and the amount of H is approximately $1.5 \times 10^{14}$ cm$^{-2}$ in areal density. It was found that, in this modification, wrong writing is not caused, and the erasing speed can be made higher accordingly, as in the fourth example. This interfacial control film 9c has a large interfacial state induced in a position of 5.6 eV from the vacuum level at the interface between the control electrode 10a made of TaN and the charge block film 8 made of LaAlO$_3$, HfO$_2$, or HfSiON. The Fermi level is pinned in the interfacial state.

Unlike the comparative example of the first example, this modification does not cause wrong writing at all, despite the use of a TaN electrode. Unlike the fourth example, this modification can employ a control electrode made of TaN, which has been conventionally used. This aspect is an advantage of this modification that involves the interfacial state.

As described above, in accordance with this modification, high-speed writing and high-speed erasing can be performed.

(Second Modification)

Figure 22:
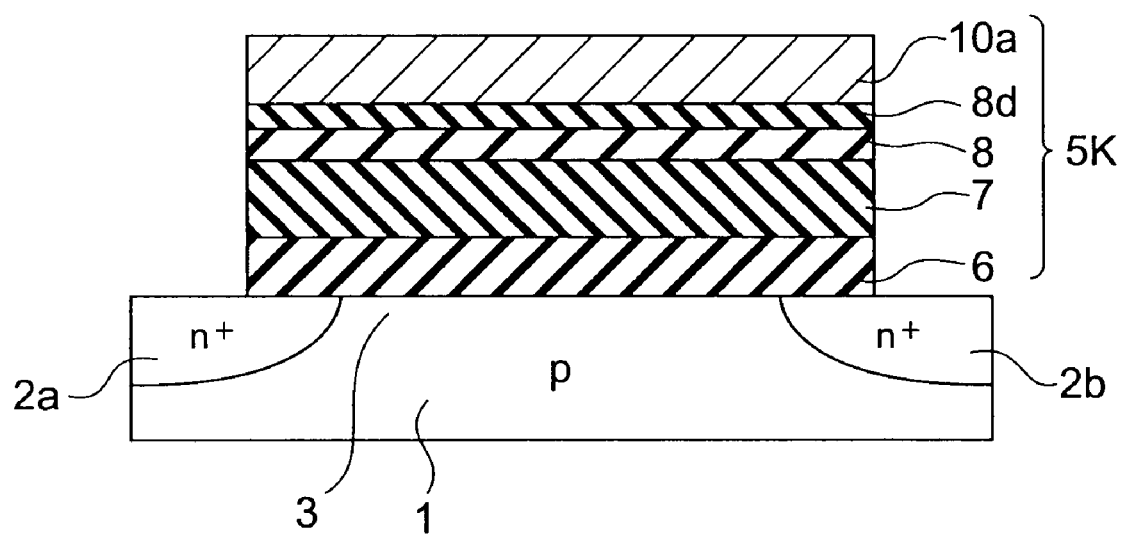
FIG. 22 is a cross-sectional view of a memory cell according to a second modification of the fourth example.

Referring now to FIG. 22, a nonvolatile semiconductor memory in accordance with a second modification of the fourth example is described. The nonvolatile semiconductor memory of this modification includes memory cells that are arranged in a matrix form. FIG. 22 is a cross-sectional view of one of the memory cells. Each of the memory cells of this modification is the same as the memory cell of the fourth example shown in FIG. 20, except that a control electrode 10a made of TaN is used as the control electrode, and a charge block film 8d with a modified outermost surface is provided between the control electrode 10a and the charge block film 8. Accordingly, this memory cell has a gate 5K formed on the channel region 3, and the gate 5K is a stacked structure that includes a tunnel insulating film 6 made of SiO$_2$, a charge storage film 7 made of SiN, the charge block film 8 made of LaAlO$_3$, HfO$_2$, or HfSiON, the charge block film 8d, and the control electrode 10a made of TaN stacked in this order.

The charge block film 8d is formed in the following manner. A 4-nm thick HfO$_2$ film is formed on the charge block film 8 made of LaAlO$_3$, HfO$_2$, or HfSiON, and a Mn metal film is formed by sputtering. By carrying out low-temperature treatment in H plasma, the charge block film 8d having Mn and H diffused into the 2-nm upper region of the HfO$_2$ film is formed. The amount of Mn is approximately $2 \times 10^{13}$ cm$^{-2}$ in areal density, and the amount of H is approximately $1.5 \times 10^{13}$ cm$^{-2}$ in areal density. Since the amount of Mn is smaller than that in the fourth example, the HfO$_2$ film is not turned into a metal film. At the interface between the charge block film 8 and the control electrode 10a, an interfacial state is artificially distributed within the gap in the charge block film 8. With the combinations of materials disclosed in this modification, the energy position of this interfacial state is 5.6 eV from the vacuum level. Accordingly, the effective work function of the control electrode 10a can be fixed at the set value of 5.6 eV. In this modification, the charge block film 8d is also referred to as an interfacial control oxide film, as in the second modification of the first example. In this modification, wrong writing is not caused at all as in the fourth example, and the erasing speed can be made higher accordingly.

Unlike the fourth example, this modification has the interfacial control oxide film 8d as a charge block film, and a control electrode 10 made of TaN with a work function that is not very large. Accordingly, by modifying the interface between the charge block film and the control electrode, TaN, which has been conventionally used as a control electrode, can be turned into a control electrode having a large effective work function.

As described above, in accordance with this modification, high-speed writing and high-speed erasing can be performed.

In the fourth example and its modifications, a H$_4$ gas or H plasma may be used to add H during the film formation. Also, H may be introduced into the substrate, the side walls, and the gate electrode in advance by a simultaneous sputtering technique or an ion injection technique, so that H is introduced into the interface control film or the interfacial control oxide film through heat treatment. There is a gap inner state in the interfacial control film and the interfacial control oxide film in the first and second modifications of the fourth example, and electrons can be accepted in the gap inner state. The energy state can be stabilized by moving electrons to the gap inner state. In this manner, H can be stably added to the interfacial control film and the HfO$_2$ thin film having a metal added thereto.

The first through fourth examples and their modifications have the following advantages:

1) When writing is performed, a high positive voltage is applied to the control electrode. With the use of the materials and structure described in any of the first through fourth examples and their modifications, a sufficiently large barrier against holes can be formed between the charge block film and the control electrode, and holes are not wrongly written from the electrode side. Thus, high-speed writing can be performed.

2) When erasing is performed, a negative voltage having a large absolute value is applied to the control electrode. With the use of the materials and structure described in any of the first through fourth examples and their modifications, a sufficiently large barrier against electrons can be formed between the charge block film and the control electrode, and electrons are not wrongly written from the control electrode side. Thus, high-speed erasing can be performed.

In the above described the embodiment, examples and their modifications, specific examples of memory cell structures formed on silicon substrates have been described. However, the present invention is not limited to those structures. For example, a silicon layer may be formed on a glass substrate, instead of a silicon substrate, and a memory cell structure of any of the above described embodiments and modifications can be formed on the silicon layer. With such a structure, a nonvolatile semiconductor memory may be formed in the control driving circuit of a display element such as a liquid crystal display element. Other than a glass substrate, it is possible to use a substrate such as a ceramics substrate that can endure the processing temperature at the time of molding, or a substrate that does not generate an unnecessary gas during the processing.

Any of the nonvolatile semiconductor memories of the above described the embodiment, examples and their modifications can be mounted on a stationary or portable electronic device (such as a personal computer, a telephone device, a PDA, a television set, a navigation system, or a sound player), and can be used as a memory that stores data, application software, or programs.

Furthermore, any of the nonvolatile semiconductor memories of the above described the embodiment, examples and their modifications can store image data and audio data in an image pick-up device (such as a digital still camera or a digital video camera). Also, any of the nonvolatile semiconductor memories of the above described the embodiment, examples and their modifications can readily function in place of a memory or a hard disk drive (HDD) mounted in a household electric appliance, a complex printer-FAX device, or the like, which performs communications over a network such as the Internet or a LAN network.

As described above, the nonvolatile semiconductor memories of the first through fourth examples and their modifications are very useful in storing or temporarily storing data, like the memories and HDDs in conventional devices. Also, any of the nonvolatile semiconductor memories of the above described the embodiment, examples and their modifications can be mounted in a memory combined system that includes a nonvolatile memory as an internal memory or a cache memory of a system LSI in an electronic component circuit. In a more sophisticated case, any of the nonvolatile semiconductor memories of the above described the embodiment, examples and their modifications can be used as a memory of a rewritable system LSI in which the system (the functions of circuits and the likes) are rewritten if necessary.

In the above described the embodiment, examples and their modifications, MONOS (Metal-Oxide-Nitride-Oxide-Silicon) flash memories have been described as examples. However, the present invention may be applied to a FG (Floating Gate) flash memory. Also, the present invention may be readily applied to a system LSI that has a memory circuit and a logic circuit mounted on the same chip, with MONOS flash memories or FG (Floating Gate) flash memories being integrated into the memory circuit.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A nonvolatile semiconductor memory device comprising:
   a semiconductor substrate; and
   a memory cell including:
      a source region and a drain region formed at a distance from each other on the semiconductor substrate;
      a tunnel insulating film formed on a channel region of the semiconductor substrate, the channel region being located between the source region and the drain region;
      a charge storage film formed on the tunnel insulating film;
      a charge block film formed on the charge storage film; and
      a control electrode that is formed on the charge block film, the control electrode including a Hf oxide film or a Zr oxide film having at least one element selected from the first group consisting of V, Cr, Mn, and Tc added thereto, and having at least one element selected from the second group consisting of F, H, and Ta added thereto.

2. The device according to claim 1, wherein the element selected from the first group has areal density in the range of $1 \times 10^{14}$ cm$^{-2}$ to $8 \times 10^{14}$ cm$^{-2}$.

3. The device according to claim 1, wherein:
   in the Hf oxide film or the Zr oxide film, an amount [B] of the element B selected from the second group satisfies the following inequation with respect to an amount [A] of the element A selected from the first group:

$$0.08 \times [A] < [B] < [A] \times (8-M)$$

M being the number of outermost electrons of the element A;
   when the element A is V, M is 5;
   when the element A is Cr, M is 6;
   when the element A is Mn, M is 7; and
   when the element A is Tc, M is 7.

4. The device according to claim 1, wherein:
   when the control electrode includes the Hf oxide film, the element selected from the first group or Ta selected from the second group is replaced with Hf of the Hf oxide film, and the element F or H selected from the second group is replaced with the oxygen of the Hf oxide film; and when the control electrode includes the Zr oxide film, the element selected from the first group or Ta selected from the second group is replaced with Zr of the Zr oxide film, and the element F or H selected from the second group is replaced with the oxygen of the Zr oxide film.

5. The device according to claim 1, wherein the charge block film is made of hafnia, hafnium silicate, hafnium aluminate, lanthanum hafnate, yttrium hafnate, strontium hafnate, zirconia, zirconium silicate, zirconium aluminate, lanthanum zirconate, yttrium zirconate, or strontium zirconate, or is a film of a nitride of hafnia, hafnium silicate, hafnium aluminate, lanthanum hafnate, yttrium hafnate, strontium hafnate, zirconia, zirconium silicate, zirconium aluminate, lanthanum zirconate, yttrium zirconate, or strontium zirconate, or is a stacked-layer film containing layers made of hafnia, hafnium silicate, hafnium aluminate, lanthanum hafnate, yttrium hafnate, strontium hafnate, zirconia, zirconium silicate, zirconium aluminate, lanthanum zirconate, yttrium zirconate, or strontium zirconate.

6. The device according to claim 1, wherein the charge block film is made of $(La_2O_3)_p (Y_2O_3)_q (Al_2O_3)_r (SiO_2)_s$ (p, q, r, and s each being zero or a positive real number), or is a film of a nitride of $(La_2O_3)_p (Y_2O_3)_q (Al_2O_3)_r (SiO_2)_s$, or is a stacked-layer film containing layers made of $(La_2O_3)_p (Y_2O_3)_q (Al_2O_3)_r (SiO_2)_s$.

7. A nonvolatile semiconductor memory device comprising:
a semiconductor substrate; and
a memory cell including:
a source region and a drain region formed at a distance from each other on the semiconductor substrate;
a tunnel insulating film formed on a channel region of the semiconductor substrate, the channel region being located between the source region and the drain region;
a charge storage film formed on the tunnel insulating film;
a charge block film formed on the charge storage film;
an oxide film formed on the charge block film, the oxide film including a Hf oxide film or a Zr oxide film having at least one element selected from the first group consisting of V, Cr, Mn, and Tc added thereto, and having at least one element selected from the second group consisting of F, H, and Ta added thereto; and
a control electrode formed on the oxide film.

8. The device according to claim 7, wherein the element selected from the first group has areal density in the range of $1\times10^{14}$ cm$^{-2}$ to $8\times10^{14}$ cm$^{-2}$.

9. The device according to claim 7, wherein the element selected from the first group has areal density in the range of $6\times10^{12}$ cm$^{-2}$ or more but less than $1\times10^{14}$ cm$^{-2}$.

10. The device according to claim 7, wherein:
in the Hf oxide film or the Zr oxide film, an amount [B] of the element B selected from the second group satisfies the following inequation with respect to an amount [A] of the element A selected from the first group:

$0.08\times[A]<[B]<[A]\times(8-M)$

M being the number of outermost electrons of the element A;
when the element A is V, M is 5;
when the element A is Cr, M is 6;
when the element A is Mn, M is 7; and
when the element A is Tc, M is 7.

11. The device according to claim 7, wherein:
when the oxide film includes the Hf oxide film, the element selected from the first group or Ta selected from the second group is replaced with Hf of the Hf oxide film, and the element F or H selected from the second group is replaced with the oxygen of the Hf oxide film; and
when the oxide film includes the Zr oxide film, the element selected from the first group or Ta selected from the second group is replaced with Zr of the Zr oxide film, and the element F or H selected from the second group is replaced with the oxygen of the Zr oxide film.

12. The device according to claim 7, wherein the charge block film is made of hafnia, hafnium silicate, hafnium aluminate, lanthanum hafnate, yttrium hafnate, strontium hafnate, zirconia, zirconium silicate, zirconium aluminate, lanthanum zirconate, yttrium zirconate, or strontium zirconate, or is a film of a nitride of hafnia, hafnium silicate, hafnium aluminate, lanthanum hafnate, yttrium hafnate, strontium hafnate, zirconia, zirconium silicate, zirconium aluminate, lanthanum zirconate, yttrium zirconate, or strontium zirconate, or is a stacked-layer film containing layers made of hafnia, hafnium silicate, hafnium aluminate, lanthanum hafnate, yttrium hafnate, strontium hafnate, zirconia, zirconium silicate, zirconium aluminate, lanthanum zirconate, yttrium zirconate, or strontium zirconate.

13. The device according to claim 7, wherein the charge block film is made of $(La_2O_3)_p (Y_2O_3)_q (Al_2O_3)_r (SiO_2)_s$ (p, q, r, and s each being zero or a positive real number), or is a film of a nitride of $(La_2O_3)_p (Y_2O_3)_q (Al_2O_3)_r (SiO_2)_s$, or is a stacked-layer film containing layers made of $(La_2O_3)_p (Y_2O_3)_q (Al_2O_3)_r (SiO_2)_s$.

14. A nonvolatile semiconductor memory device comprising:
a semiconductor substrate; and
a memory cell including:
a source region and a drain region formed at a distance from each other on the semiconductor substrate;
a tunnel insulating film formed on a channel region of the semiconductor substrate, the channel region being located between the source region and the drain region;
a charge storage film formed on the tunnel insulating film;
a charge block film formed on the charge storage film; and
a control electrode formed on the charge block film, the control electrode including a Hf oxide film or a Zr oxide film having at least one element selected from the first group consisting of Nb, Mo, W, and Re added thereto, and having at least one element selected from the second group consisting of N, C, B, Mg, Ca, Sr, Ba, Al, Sc, Y, La, Ce, Pr, Nd, Pm, Sm, Eu, Gd, Tb, Dy, Ho, Er, Tm, Yb, and Lu added thereto.

15. The device according to claim 14, wherein the element selected from the first group has areal density in the range of $1\times10^{14}$ cm$^{-2}$ to $8\times10^{14}$ cm$^{-2}$.

16. The device according to claim 14, wherein:
in the Hf oxide film or the Zr oxide film, an amount [β] of the element β selected from the second group satisfies the following inequation with respect to an amount [α] of the element a selected from the first group:

$0.08\times[\alpha]<[\beta]\times K<[\alpha]\times(L-4)$

L being the number of outermost electrons of the element α, K being the number of electrons that the element β can accept;
when the element α is Nb, L is 5;

when the element α is Mo, L is 6;
when the element α is W, L is 6;
when the element α is Re, L is 7;
when the element β is N, K is 1;
when the element β is C, K is 2;
when the element β is B, K is 3;
when the element β is Mg, Ca, Sr, or Ba, K is 2; and
when the element β is Al, Sc, Y, La, Ce, Pr, Nd, Pm, Sm, Eu, Gd, Tb, Dy, Ho, Er, Tm, Yb, or Lu, K is 1.

17. The device according to claim 14, wherein:
when the control electrode includes the Hf oxide film, the element selected from the first group or Mg, Ca, Sr, Ba, Al, Sc, Y, La, Ce, Pr, Nd, Pm, Sm, Eu, Gd, Tb, Dy, Ho, Er, Tm, Yb, or Lu selected from the second group is replaced with Hf of the Hf oxide film, and the element N, C, or B selected from the second group is replaced with the oxygen of the Hf oxide film; and
when the control electrode includes the Zr oxide film, the element selected from the first group or Mg, Ca, Sr, Ba, Al, Sc, Y, La, Ce, Pr, Nd, Pm, Sm, Eu, Gd, Tb, Dy, Ho, Er, Tm, Yb, or Lu selected from the second group is replaced with Zr of the Zr oxide film, and the element N, C, or B selected from the second group is replaced with the oxygen of the Zr oxide film.

18. The device according to claim 14, wherein
the charge block film is made of hafnia, hafnium silicate, hafnium aluminate, lanthanum hafnate, yttrium hafnate, strontium hafnate, zirconia, zirconium silicate, zirconium aluminate, lanthanum zirconate, yttrium zirconate, or strontium zirconate, or is a film of a nitride of hafnia, hafnium silicate, hafnium aluminate, lanthanum hafnate, yttrium hafnate, strontium hafnate, zirconia, zirconium silicate, zirconium aluminate, lanthanum zirconate, yttrium zirconate, or strontium zirconate, or is a stacked-layer film containing layers made of hafnia, hafnium silicate, hafnium aluminate, lanthanum hafnate, yttrium hafnate, strontium hafnate, zirconia, zirconium silicate, zirconium aluminate, lanthanum zirconate, yttrium zirconate, or strontium zirconate.

19. The device according to claim 14, wherein the charge block film is made of $(La_2O_3)_p (Y_2O_3)_q (Al_2O_3)_r (SiO_2)_s$ (p, q, r, and s each being zero or a positive real number), or is a film of a nitride of $(La_2O_3)_p (Y_2O_3)_q (Al_2O_3)_r (SiO_2)_r$, or is a stacked-layer film containing layers made of $(La_2O_3)_p (Y_2O_3)_q (Al_2O_3)_r (SiO_2)_s$.

20. A nonvolatile semiconductor memory device comprising:
a semiconductor substrate; and
a memory cell including:
a source region and a drain region formed at a distance from each other on the semiconductor substrate;
a tunnel insulating film formed on a channel region of the semiconductor substrate, the channel region being located between the source region and the the drain region;
a charge storage film formed on the tunnel insulating film;
a charge block film formed on the charge storage film;
an oxide film formed on the charge block film, the oxide film including a Hf oxide film or a Zr oxide film having at least one element selected from the first group consisting of Nb, Mo, W, and Re added thereto, and having at least one element selected from the second group consisting of N, C, B, Mg, Ca, Sr, Ba, Al, Sc, Y, La, Ce, Pr, Nd, Pm, Sm, Eu, Gd, Tb, Dy, Ho, Er, Tm, Yb, and Lu added thereto; and
a control electrode formed on the oxide film.

21. The device according to claim 20, wherein the element selected from the first group has areal density in the range of $1 \times 10^{14}$ cm$^{-2}$ to $8 \times 10^{14}$ cm$^{-2}$.

22. The device according to claim 20, wherein the element selected from the first group has areal density in the range of $6 \times 10^{12}$ cm$^{-2}$ or more but less than $1 \times 10^{14}$ cm$^{-2}$.

23. The device according to claim 20, wherein:
in the Hf oxide film or the Zr oxide film, an amount [β] of the element β selected from the second group satisfies the following inequation with respect to an amount [α] of the element α selected from the first group:

$$0.08 \times [\alpha] < [\beta] \times K < [\alpha] \times (L-4)$$

L being the number of outermost electrons of the element α, K being the number of electrons that the element β can accept;
when the element α is Nb, L is 5;
when the element α is Mo, L is 6;
when the element α is W, L is 6;
when the element α is Re, L is 7;
when the element β is N, K is 1;
when the element β is C, K is 2;
when the element β is B, K is 3;
when the element β is Mg, Ca, Sr, or Ba, K is 2; and
when the element β is Al, Sc, Y, La, Ce, Pr, Nd, Pm, Sm, Eu, Gd, Tb, Dy, Ho, Er, Tm, Yb, or Lu, K is 1.

24. The device according to claim 20, wherein:
when the oxide film includes the Hf oxide film, the element selected from the first group or Mg, Ca, Sr, Ba, Al, Sc, Y, La, Ce, Pr, Nd, Pm, Sm, Eu, Gd, Tb, Dy, Ho, Er, Tm, Yb, or Lu selected from the second group is replaced with Hf of the Hf oxide film, and the element N, C, or B selected from the second group is replaced with the oxygen of the Hf oxide film; and
when the oxide film includes the Zr oxide film, the element selected from the first group or Mg, Ca, Sr, Ba, Al, Sc, Y, La, Ce, Pr, Nd, Pm, Sm, Eu, Gd, Tb, Dy, Ho, Er, Tm, Yb, or Lu selected from the second group is replaced with Zr of the Zr oxide film, and the element N, C, or B selected from the second group is replaced with the oxygen of the Zr oxide film.

25. The device according to claim 20, wherein
the charge block film is made of hafnia, hafnium silicate, hafnium aluminate, lanthanum hafnate, yttrium hafnate, strontium hafnate, zirconia, zirconium silicate, zirconium aluminate, lanthanum zirconate, yttrium zirconate, or strontium zirconate, or is a film of a nitride of hafnia, hafnium silicate, hafnium aluminate, lanthanum hafnate, yttrium hafnate, strontium hafnate, zirconia, zirconium silicate, zirconium aluminate, lanthanum zirconate, yttrium zirconate, or strontium zirconate, or is a stacked-layer film containing layers made of hafnia, hafnium silicate, hafnium aluminate, lanthanum hafnate, yttrium hafnate, strontium hafnate, zirconia, zirconium silicate, zirconium aluminate, lanthanum zirconate, yttrium zirconate, or strontium zirconate.

26. The device according to claim 20, wherein the charge block film is made of $(La_2O_3)_p (Y_2O_3)_q (Al_2O_3)_r (SiO_2)_s$ (p, q, r, and s each being zero or a positive real number), or is a film of a nitride of $(La_2O_3)_p (Y_2O_3)_q (Al_2O_3)_r (SiO_2)_s$, or is a stacked-layer film containing layers made of $(La_2O_3)_p (Y_2O_3)_q (Al_2O_3)_r (SiO_2)_s$.

* * * * *